(12) United States Patent
Sherrer et al.

(10) Patent No.: US 9,993,982 B2
(45) Date of Patent: Jun. 12, 2018

(54) METHODS OF FABRICATING ELECTRONIC AND MECHANICAL STRUCTURES

(75) Inventors: David W. Sherrer, Radford, VA (US); Dara L. Cardwell, Pulaski, VA (US)

(73) Assignee: NUVOTRONICS, INC., Radford, VA (US)

( * ) Notice: Subject to any disclaimer, the term of this patent is extended or adjusted under 35 U.S.C. 154(b) by 940 days.

(21) Appl. No.: 14/232,396

(22) PCT Filed: Jul. 13, 2012

(86) PCT No.: PCT/US2012/046734
§ 371 (c)(1),
(2), (4) Date: May 5, 2014

(87) PCT Pub. No.: WO2013/010108
PCT Pub. Date: Jan. 17, 2013

(65) Prior Publication Data
US 2014/0231266 A1   Aug. 21, 2014

Related U.S. Application Data

(60) Provisional application No. 61/507,496, filed on Jul. 13, 2011.

(51) Int. Cl.
*B29C 67/00* (2017.01)
*C25D 5/02* (2006.01)
(Continued)

(52) U.S. Cl.
CPC ............ *B29C 70/882* (2013.01); *B22D 19/00* (2013.01); *B29C 67/0051* (2013.01);
(Continued)

(58) Field of Classification Search
None
See application file for complete search history.

(56) References Cited

U.S. PATENT DOCUMENTS

| 738,484 A | 9/1903 | Regester |
| 2,743,505 A | 5/1956 | Hill |

(Continued)

FOREIGN PATENT DOCUMENTS

| CA | 2055116 A1 | 5/1992 |
| DE | 3623093 A1 | 1/1988 |

(Continued)

OTHER PUBLICATIONS

M. Charbonnier, et al, Electroless plating of polymers: XPS study of the initiation mechanisms, Journal of Applied Electrochemistry 28, (1998) 449±453.

(Continued)

*Primary Examiner* — Lisha Jiang
(74) *Attorney, Agent, or Firm* — Niels Haun; Dann, Dorfman, Herrell & Skillman, P.C.

(57) ABSTRACT

The present invention relates to the fabrication of complicated electronic and/or mechanical structures and devices and components using homogeneous or heterogeneous 3D additive build processes. In particular the invention relates to selective metallization processes including electroless and/or electrolytic metallization.

15 Claims, 18 Drawing Sheets

(51) Int. Cl.
  *C25D 5/34* (2006.01)
  *B22D 19/00* (2006.01)
  *B29C 70/88* (2006.01)
  *H05K 3/12* (2006.01)
  *H05K 3/46* (2006.01)

(52) U.S. Cl.
  CPC ............ *B29C 67/0055* (2013.01); *C25D 5/02* (2013.01); *H05K 3/1275* (2013.01); *H05K 3/4664* (2013.01); *H05K 2201/0191* (2013.01); *H05K 2201/0195* (2013.01)

(56) References Cited

U.S. PATENT DOCUMENTS

| | | |
|---|---|---|
| 2,812,501 A | 11/1957 | Sommers |
| 2,914,766 A | 11/1959 | Butler |
| 2,997,519 A | 8/1961 | Hines |
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,526,867 A | 9/1970 | Keeler |
| 3,537,043 A | 10/1970 | Smith |
| 3,560,896 A | 2/1971 | Essinger |
| 3,577,105 A | 5/1971 | Jones |
| 3,598,107 A | 8/1971 | Ishikawa |
| 3,760,306 A | 9/1973 | Spinner |
| 3,775,844 A | 12/1973 | Parks |
| 3,789,129 A | 1/1974 | Ditscheid |
| 3,791,858 A | 2/1974 | McPherson |
| 3,884,549 A | 5/1975 | Wang |
| 3,963,999 A | 6/1976 | Nakajima |
| 4,021,789 A | 5/1977 | Furman |
| 4,033,656 A | 7/1977 | Freehauf |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert |
| 4,414,424 A | 11/1983 | Mizoguchi |
| 4,417,393 A | 11/1983 | Becker |
| 4,437,074 A | 3/1984 | Cohen |
| 4,521,755 A | 6/1985 | Carlson |
| 4,539,534 A | 9/1985 | Hudspeth |
| 4,581,301 A | 4/1986 | Michaelson |
| 4,591,411 A | 5/1986 | Reimann |
| 4,641,140 A | 2/1987 | Heckaman |
| 4,647,878 A | 3/1987 | Landis |
| 4,663,497 A | 5/1987 | Reimann |
| 4,673,904 A | 6/1987 | Landis |
| 4,684,181 A | 8/1987 | Massit |
| 4,700,159 A | 10/1987 | Jones |
| 4,717,064 A | 1/1988 | Popielarski |
| 4,771,294 A | 9/1988 | Wasilousky |
| 4,808,273 A | 2/1989 | Hua |
| 4,832,461 A | 5/1989 | Yamagishi |
| 4,853,656 A | 8/1989 | Guillou |
| 4,856,184 A | 8/1989 | Doeling |
| 4,857,418 A | 8/1989 | Schuetz |
| 4,859,806 A | 8/1989 | Smith |
| 4,876,322 A | 10/1989 | Budde |
| 4,880,684 A | 11/1989 | Boss |
| 4,909,909 A | 3/1990 | Florjancic |
| 4,915,983 A | 4/1990 | Lake |
| 4,969,979 A | 11/1990 | Appelt |
| 4,975,142 A | 12/1990 | Iannacone |
| 5,069,749 A | 12/1991 | Gutierrez |
| 5,072,201 A | 12/1991 | Devaux |
| 5,089,880 A | 2/1992 | Meyer |
| 5,100,501 A | 3/1992 | Blumenthal |
| 5,119,049 A | 6/1992 | Heller |
| 5,132,248 A | 7/1992 | Drummond |
| 5,191,699 A | 3/1993 | Ganslmeier |
| 5,213,511 A | 5/1993 | Sobhani |
| 5,227,013 A | 7/1993 | Kumar |
| 5,235,208 A | 8/1993 | Katoh |
| 5,274,484 A | 12/1993 | Mochizuki |
| 5,299,939 A | 4/1994 | Walker |
| 5,312,456 A | 5/1994 | Reed |
| 5,334,956 A | 8/1994 | Leding |
| 5,381,157 A | 1/1995 | Shiga |
| 5,406,235 A | 4/1995 | Hayashi |
| 5,406,423 A | 4/1995 | Hayashi |
| 5,430,257 A | 7/1995 | Lau |
| 5,454,161 A | 10/1995 | Beilin |
| 5,529,504 A | 6/1996 | Greenstein |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer |
| 5,724,012 A | 3/1998 | Teunisse |
| 5,724,484 A | 3/1998 | Kagami |
| 5,746,868 A | 5/1998 | Abe |
| 5,793,272 A | 8/1998 | Burghartz |
| 5,814,889 A | 9/1998 | Gaul |
| 5,860,812 A | 1/1999 | Gugliotti |
| 5,872,399 A | 2/1999 | Lee |
| 5,903,059 A | 5/1999 | Bertin |
| 5,925,206 A | 7/1999 | Boyko |
| 5,940,674 A | 8/1999 | Sachs |
| 5,961,347 A | 10/1999 | Hsu |
| 5,977,842 A | 11/1999 | Brown |
| 5,990,768 A | 11/1999 | Takahashi |
| 6,008,102 A | 12/1999 | Alford |
| 6,027,630 A | 2/2000 | Cohen |
| 6,054,252 A | 4/2000 | Lundy |
| 6,180,261 B1 | 1/2001 | Inoue |
| 6,183,268 B1 | 2/2001 | Consoli |
| 6,207,901 B1 | 3/2001 | Smith |
| 6,210,221 B1 | 4/2001 | Maury |
| 6,228,466 B1 | 5/2001 | Tsukada |
| 6,232,669 B1 | 5/2001 | Khoury |
| 6,294,401 B1 | 9/2001 | Jacobson |
| 6,294,965 B1 | 9/2001 | Merrill |
| 6,329,605 B1 | 12/2001 | Beroz |
| 6,350,633 B1 | 2/2002 | Lin |
| 6,388,198 B1 | 5/2002 | Bertin |
| 6,401,001 B1 | 6/2002 | Jang |
| 6,457,979 B1 | 10/2002 | Dove |
| 6,465,747 B2 | 10/2002 | DiStefano |
| 6,466,112 B1 | 10/2002 | Kwon |
| 6,514,845 B1 | 2/2003 | Eng |
| 6,518,165 B1 | 2/2003 | Yoon |
| 6,535,088 B1 | 3/2003 | Sherman |
| 6,589,594 B1 | 7/2003 | Hembree |
| 6,600,395 B1 | 7/2003 | Handforth |
| 6,603,376 B1 | 8/2003 | Handforth |
| 6,648,653 B2 | 11/2003 | Huang |
| 6,662,443 B2 | 12/2003 | Chou |
| 6,677,248 B2 | 1/2004 | Kwon |
| 6,735,009 B2 | 5/2004 | Li |
| 6,746,891 B2 | 6/2004 | Cunningham |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,849,308 B1 | 2/2005 | Speakman |
| 6,850,084 B2 | 2/2005 | Hembree |
| 6,888,427 B2 | 5/2005 | Sinsheimer |
| 6,889,433 B1 | 5/2005 | Enomoto |
| 6,914,513 B1 | 7/2005 | Wahlers |
| 6,917,086 B2 | 7/2005 | Cunningham |
| 6,943,452 B2 | 9/2005 | Bertin |
| 6,971,913 B1 | 12/2005 | Chu |
| 6,975,267 B2 | 12/2005 | Stenger |
| 6,981,414 B2 | 1/2006 | Knowles |
| 7,005,750 B2 | 2/2006 | Liu |
| 7,012,489 B2 | 3/2006 | Sherrer |
| 7,030,712 B2 | 4/2006 | Brunette |
| 7,061,343 B2 | 6/2006 | Perkins |
| 7,064,449 B2 | 6/2006 | Lin |
| 7,077,697 B2 | 7/2006 | Kooiman |
| 7,084,722 B2 | 8/2006 | Goyette |

(56) References Cited

U.S. PATENT DOCUMENTS

| | | |
|---|---|---|
| 7,109,822 B2 | 9/2006 | Perkins |
| D530,674 S | 10/2006 | Ko |
| 7,116,190 B2 | 10/2006 | Brunker |
| 7,129,163 B2 | 10/2006 | Sherrer |
| 7,148,141 B2 | 12/2006 | Shim |
| 7,148,722 B1 | 12/2006 | Cliff |
| 7,148,772 B2 | 12/2006 | Sherrer |
| 7,165,974 B2 | 1/2007 | Kooiman |
| 7,202,155 B2 | 4/2007 | Fukuchi |
| 7,217,156 B2 | 5/2007 | Wang |
| 7,222,420 B2 | 5/2007 | Moriizumi |
| 7,239,219 B2 | 7/2007 | Brown |
| 7,252,861 B2 | 8/2007 | Smalley |
| 7,259,640 B2 | 8/2007 | Brown |
| 7,277,770 B2 | 10/2007 | Huang |
| 7,291,380 B2 | 11/2007 | Nyholm |
| 7,383,632 B2 | 6/2008 | Dittmann |
| 7,388,388 B2 | 6/2008 | Dong |
| 7,400,222 B2 | 7/2008 | Kwon |
| 7,405,638 B2 | 7/2008 | Sherrer |
| 7,442,643 B2 | 10/2008 | Wood |
| 7,449,784 B2 | 11/2008 | Sherrer |
| 7,478,475 B2 | 1/2009 | Hall |
| 7,508,065 B2 | 3/2009 | Sherrer |
| 7,532,163 B2 | 5/2009 | Chang |
| 7,555,309 B2 | 6/2009 | Baldor |
| 7,575,474 B1 | 8/2009 | Dodson |
| 7,579,553 B2 | 8/2009 | Moriizumi |
| 7,602,059 B2 | 10/2009 | Nobutaka |
| 7,619,441 B1 | 11/2009 | Rahman |
| 7,628,617 B2 | 12/2009 | Brown |
| 7,645,147 B2 | 1/2010 | Dittmann |
| 7,645,940 B2 | 1/2010 | Shepherd |
| 7,649,432 B2 | 1/2010 | Sherrer |
| 7,656,256 B2 | 2/2010 | Houck |
| 7,658,831 B2 | 2/2010 | Mathieu |
| 7,683,842 B1 | 3/2010 | Engel |
| 7,705,456 B2 | 4/2010 | Hu |
| 7,755,174 B2 | 7/2010 | Rollin |
| 7,830,228 B2 | 11/2010 | Brown |
| 7,898,356 B2 | 3/2011 | Sherrer |
| 7,948,335 B2 | 5/2011 | Sherrer |
| 7,972,650 B1 | 7/2011 | Church |
| 8,011,959 B1 | 9/2011 | Tsai |
| 8,031,037 B2 | 10/2011 | Sherrer |
| 8,067,305 B2 | 11/2011 | Zafiropoulo |
| 8,188,932 B2 | 5/2012 | Worl |
| 8,264,297 B2 | 9/2012 | Thompson |
| 8,304,666 B2 | 11/2012 | Ko |
| 8,339,232 B2 | 12/2012 | Lotfi |
| 8,441,118 B2 | 5/2013 | Hua |
| 8,522,430 B2 | 9/2013 | Kacker |
| 8,542,079 B2 | 9/2013 | Sherrer |
| 8,641,428 B2 | 2/2014 | Light |
| 8,674,872 B2 | 3/2014 | Billaud |
| 8,742,874 B2 | 6/2014 | Sherrer |
| 8,814,601 B1 | 8/2014 | Sherrer |
| 8,888,504 B2 | 11/2014 | Pischler |
| 9,306,254 B1 | 4/2016 | Hovey |
| 9,325,044 B2 | 4/2016 | Reid |
| 9,583,856 B2 | 2/2017 | Sherrer |
| 9,633,976 B1 | 4/2017 | Bernstein |
| 9,888,600 B2 | 2/2018 | Hovey |
| 2001/0040051 A1 | 11/2001 | Lipponen |
| 2001/0045361 A1* | 11/2001 | Boone ............... H05K 3/182 205/118 |
| 2002/0075104 A1 | 6/2002 | Kwon |
| 2002/0127768 A1* | 9/2002 | Badir ............ H01L 23/49811 438/106 |
| 2003/0029729 A1 | 2/2003 | Cheng |
| 2003/0052755 A1 | 3/2003 | Barnes |
| 2003/0117237 A1 | 6/2003 | Niu |
| 2003/0221968 A1 | 12/2003 | Cohen |
| 2003/0222738 A1 | 12/2003 | Brown |
| 2004/0000701 A1 | 1/2004 | White |
| 2004/0003524 A1* | 1/2004 | Ha ..................... G09F 13/22 40/545 |
| 2004/0004061 A1 | 1/2004 | Merdan |
| 2004/0007468 A1 | 1/2004 | Cohen |
| 2004/0007470 A1 | 1/2004 | Smalley |
| 2004/0029354 A1 | 2/2004 | You |
| 2004/0038586 A1 | 2/2004 | Hall |
| 2004/0076806 A1 | 4/2004 | Miyanaga |
| 2004/0124961 A1 | 7/2004 | Aoyagi |
| 2004/0129152 A1 | 7/2004 | Beisswenger |
| 2004/0196112 A1 | 10/2004 | Welbon |
| 2004/0206263 A1 | 10/2004 | Altmann |
| 2004/0263290 A1* | 12/2004 | Sherrer ................ H01P 1/08 333/243 |
| 2005/0030124 A1 | 2/2005 | Okamoto |
| 2005/0042932 A1 | 2/2005 | Mok |
| 2005/0045484 A1 | 3/2005 | Smalley |
| 2005/0156693 A1 | 7/2005 | Dove |
| 2005/0230145 A1 | 10/2005 | Ishii |
| 2005/0250253 A1 | 11/2005 | Cheung |
| 2005/0288813 A1 | 12/2005 | Yang |
| 2007/0105395 A1 | 5/2007 | Kinzel |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2009/0004385 A1* | 1/2009 | Blackwell ............ C23C 16/18 427/250 |
| 2009/0051476 A1 | 2/2009 | Tada |
| 2009/0154972 A1 | 6/2009 | Tanaka |
| 2010/0007016 A1 | 1/2010 | Oppermann |
| 2010/0015850 A1 | 1/2010 | Stein |
| 2010/0109819 A1 | 5/2010 | Houck |
| 2010/0225435 A1 | 9/2010 | Li |
| 2010/0296252 A1 | 11/2010 | Rollin |
| 2010/0323551 A1 | 12/2010 | Edridge |
| 2011/0046467 A1 | 2/2011 | Simpson |
| 2011/0123783 A1 | 5/2011 | Sherrer |
| 2011/0123794 A1 | 5/2011 | Hiller |
| 2011/0169193 A1 | 7/2011 | Bonassar |
| 2011/0181376 A1 | 7/2011 | Vanhille |
| 2011/0181377 A1 | 7/2011 | Vanhille |
| 2011/0210807 A1 | 9/2011 | Sherrer |
| 2011/0273241 A1 | 11/2011 | Sherrer |
| 2011/0304520 A1 | 12/2011 | Djordjevic |
| 2013/0050055 A1 | 2/2013 | Paradiso |
| 2013/0127577 A1 | 5/2013 | Lotfi |
| 2016/0054385 A1 | 2/2016 | Suto |
| 2016/0268665 A1 | 9/2016 | Sherrer et al. |

FOREIGN PATENT DOCUMENTS

| | | |
|---|---|---|
| EP | 0047165 | 11/1984 |
| EP | 0398019 A1 | 4/1990 |
| EP | 0266526 | 6/1990 |
| EP | 0485831 A1 | 5/1992 |
| EP | 0165685 | 9/1992 |
| EP | 0606645 | 7/1994 |
| EP | 0845831 A2 | 6/1998 |
| EP | 0911903 A2 | 4/1999 |
| EP | 1278639 | 1/2003 |
| EP | 1555863 | 7/2005 |
| EP | 1912244 | 4/2008 |
| EP | 2330875 | 6/2011 |
| FR | 2086327 A1 | 12/1971 |
| GB | 2265754 | 10/1993 |
| JP | H027587 A | 1/1990 |
| JP | 3027587 | 2/1991 |
| JP | H041710 A | 1/1992 |
| JP | H0685510 A | 3/1994 |
| JP | H06302964 A | 10/1994 |
| JP | H07060844 | 3/1995 |
| JP | H10041710 | 2/1998 |
| JP | 2003032007 | 1/2003 |
| JP | 200667621 | 3/2006 |
| JP | 2007253354 | 10/2007 |
| TW | I244799 | 12/2005 |
| WO | 1991000806 | 1/1991 |
| WO | 1995028282 | 10/1995 |

(56) References Cited

FOREIGN PATENT DOCUMENTS

| WO | 1996013390 | | 5/1996 |
|---|---|---|---|
| WO | 0007218 | A2 | 2/2000 |
| WO | 0039854 | A1 | 7/2000 |
| WO | 2000064682 | | 11/2000 |
| WO | 2001071778 | | 9/2001 |
| WO | 0206152 | A2 | 1/2002 |
| WO | 2002006152 | | 1/2002 |
| WO | 02080279 | A1 | 10/2002 |
| WO | 2004004061 | | 1/2004 |
| WO | 2005000592 | | 1/2005 |
| WO | 2005087654 | | 9/2005 |
| WO | 2005112105 | | 11/2005 |
| WO | 2006029495 | | 3/2006 |
| WO | 2006098100 | | 9/2006 |
| WO | 2007038950 | | 4/2007 |
| WO | 2007039227 | | 4/2007 |
| WO | WO 2009/013751 | A2 * | 1/2009 |
| WO | 2009119061 | | 10/2009 |
| WO | 2010111455 | | 9/2010 |
| WO | 2011006641 | | 1/2011 |
| WO | 2011036509 | | 3/2011 |
| WO | 2012070053 | | 5/2012 |

OTHER PUBLICATIONS

J. Electrochem, The Nucleation with SnCl-PdCl Solutions of Glass Before Electroless Plating, Soc.: Electrochemical Science and Technology, Dec. 1973.

European Examination Report of EP App. No. 07150463.3 dated Feb. 16, 2015.

Tian, et al.; Fabrication of multilayered SU8 structure for terahertz waveguide with ultralow transmission loss; Aug. 18, 2013; Dec. 10, 2013; pp. 13002-1 to 13002-6.

International Search Report and Written Opinian for PCT/US2015/011789 dated Apr. 10, 2015.

Derwent Abstract Translation of WO-2010-011911 A2 (published 2010).

Ali Darwish et al.; Vertical Balun and Wilkinson Divider; 2002 IEEE MTT-S Digest; pp. 109-112. NPL_30.

Brown et al., 'A Low-Loss Ka-Band Filter in Rectangular Coax Made by Electrochemical Fabrication', submitted to Microwave and Wireless Components Letters, date unknown {downloaded from www.memgen.com, 2004). NFL_1.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001. NPL_2.

Colantonio, P., et al., "High Efficiency RF and Microwave Solid State Power Amplifiers," pp. 380-395, 2009.

Cole, B.E., et al., Micromachined Pixel Arrays Integrated with CMOS for Infrared Applications, pp. 64-64 (2000). NPL_3.

De Los Santos, H.J., Introduction to Microelectromechanical (MEM) Microwave Systems {pp. 4, 7-8, 13) (1999). NPL_4.

Deyong, C, et al., A Microstructure Semiconductor Thermocouple for Microwave Power Sensors, 1997 Asia Pacific Microwave Conference, pp. 917-919. NPL_5.

Ehsan, N., "Broadband Microwave Litographic 3D Components," Dissertation 2009.

Ehsan, N. et al., "Microcoaxial lines for active hybrid-monolithic circuits," 2009 IEEE MTT-S Int. Microwave.Symp. Boston, MA, Jun. 2009.

Elliott Brown/MEMGen Corporation, 'RF Applications of EFAB Technology', MTT-S IMS 2003, pp. 1-15. NPL_6.

Engelmann et al., 'Fabrication of High Depth-to-Width Aspect Ratio Microstructures', IEEE Micro Electro Mechanical Systems (Feb. 1992), pp. 93-98.

European Examination Report dated Mar. 21, 2013 for EP Application No. 07150463.3.

European Examination Report of corresponding European Patent Application No. 08 15 3144 dated Apr. 6, 2010.

European Examination Report of corresponding European Patent Application No. 08 15 3144 dated Feb. 22, 2012.

European Examination Report of corresponding European Patent Application No. 08 15 3144 dated Nov. 10, 2008.

European Search Report for corresponding EP Application No. 07150463.3 dated Apr. 23, 2012.

European Search Report of Corresponding European Application No. 07 15 0467 dated Apr. 28, 2008.

European Search Report of corresponding European Application No. 08 15 3138 dated Jul. 4, 2008.

European Search Report of corresponding European Application No. 08153138.6 dated Jul. 15, 2008.

European Search Report of corresponding European Patent Application No. 08 15 3144 dated Jul. 2, 2008.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Filipovic et al.; 'Modeling, Design, Fabrication, and Performance of Rectangular .mu.-Coaxial Lines and Components'; Microwave Symposium Digest, 2006, IEEE; Jun. 1, 2006; pp. 1393-1396.

Franssila, S., Introduction to Microfabrication, (pp. 8) (2004). NPL_7.

Frazier et al., 'M ET ALlic Microstructures Fabricated Using Photosensitive Polyimide Electroplating Molds', Journal of Microelectromechanical Systems, vol. 2, No. 2, Jun. 1993, pp. 87-94. NPL_8.

Ghodisian, B., et al., Fabrication of Affordable M ET ALlic Microstructures by Electroplating and Photoresist Molds, 1996, pp. 68-71. NPL_9.

H. Guckel, 'High-Aspect-Ratio Micromachining Via Deep X-Ray Lithography', Proc. of IEEE, vol. 86, No. 8 (Aug. 1998), pp. 1586-1593. NPL_10.

Hawkins, C.F., The Microelectronics Failure Analysis, Desk Reference Edition (2004). NPL_11.

Immorlica, Jr., T. et al., "Miniature 3D micro-machined solid state power amplifiers," COMCAS 2008.

Ingram, D.L. et al., "A 427 mW 20% compact W-band InP HEMT MMIC power amplifier," IEEE RFIC Symp. Digest 1999, pp. 95-98.

International Preliminary Report on Patentability dated Jul. 24, 2012 for corresponding PCT/US2011/022173.

International Preliminary Report on Patentability dated May 19, 2006 on corresponding PCT/US04/06665.

International Search Report dated Aug. 29, 2005 on corresponding PCT/US04/06665.

Jeong, I., et al., "High Performance Air-Gap Transmission Lines and Inductors for Milimeter-Wave Applications", Transactions on Microwave Theory and Techniques, vol. 50, No. 12, Dec. 2002.

Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12. NPL_12.

Katehi et al., 'MEMS and Si Micromachined Circuits for High-Frequency Applications', IEEE Transactions on Microwave Theory and Techniques, vol. 50, No. 3, Mar. 2002, pp. 858-866. NPL_13.

Kenneth J. Vanhille et al.; Micro-Coaxial Imedance Transformers; Journal of Latex Class Files; vol. 6; No. 1; Jan. 2007. NPL_29.

Kwok, P.Y., et al., Fluid Effects in Vibrating Micromachined Structures, Journal of Microelectromechanical Systems, vol. 14, No. 4, Aug. 2005, pp. 770-781. NPL_14.

Lee et al., 'Micromachining Applications of a High Resolution Ultrathick Photoresist', J. Vac. Sci. Technol. B 13 (6), Nov./Dec. 1995, pp. 3012-3016. NPL_15.

(56) References Cited

OTHER PUBLICATIONS

Loechel et al., 'Application of Ultraviolet Depth Lithography for Surface Micromachining', J. Vac. Sci. Technol. B 13 (6), Nov./Dec. 1995, pp. 2934-2939. NPL_16.

Lukic, M. et al., "Surface-micromachined dual Ka-band cavity backed patch antennas," IEEE Trans. AtennasPropag., vol. 55, pp. 2107-2110, Jul. 2007.

Madou, M.J., Fundamentals of Microfabrication: The Science of Miniaturization, 2d Ed., 2002 (Roadmap; pp. 615-668). NPL_17.

Oliver, J.M. et al., "A 3-D micromachined W-band cavity backed patch antenna array with integrated rectacoax transition to wave guide," 2009 Proc. IEEE International Microwave Symposium, Boston, MA 2009.

Park et al., 'Electroplated Micro-Inductors and Micro-Transformers for Wireless application', IMAPS 2002, Denver, CO, Sep. 2002. NPL_18.

PwrSoC Update 2012: Technology, Challenges, and Opportunities for Power Supply on Chip, Presentation (Mar. 18, 2013).

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.

Saito et al., "Analysis and design of monolithic rectangular coaxial lines for minimum coupling," IEEE Trans. Microwave Theory Tech., vol. 55, pp. 2521-2530, Dec. 2007.

Sedky, S., Post-Processing Techniques for Integrated MEMS (pp. 9, 11, 164) (2006). NPL_19.

Sherrer, D, Vanhille, K, Rollin, J.M., 'PolyStrata Technology: A Disruptive Approach for 3D Microwave Components and Modules,' Presentation (Apr. 23, 2010).

Tummala et al.; 'Microelectronics Packaging Handbook'; Jan. 1, 1989; XP002477031; pp. 710-714. NPL_31.

Vanhille, K. 'Design and Characterization of Microfabricated Three-Dimensional Millimeter-Wave Components,' Dissertation, 2007.

Vanhille, K. et al., 'Balanced low-loss Ka-band -coaxial hybrids,' IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Written Opinion of the International Searching Authority dated Aug. 29, 2005 on corresponding PCT/US04/06665.

Yeh, J.L., et al., Copper-Encapsulated Silicon Micromachined Structures, Journal of Microelectromechanical Systems, vol. 9, No. 3, Sep. 2000, pp. 281-287. NPL_20.

Yoon et al., '3-D Lithography and M et al Surface Micromachining for RF and Microwave MEMs' IEEE MEMS 2002 Conference, Las Vegas, NV, Jan. 2002, pp. 673-676. NPL_21.

Yoon et al., 'CMOS-Compatible Surface Micromachined Suspended-Spiral Inductors for Multi-GHz Sillicon RF Ics', IEEE Electron Device Letters, vol. 23, No. 10, Oct. 2002, pp. 591-593. NPL_22.

Yoon et al., 'High-Performance Electroplated Solenoid-Type Integrated Inductor (SI2) for RF Applications Using Simple 3D Surface Micromachining Technology', Int'l Election Devices Meeting, 1998, San Francisco, CA, Dec. 6-9, 1998, pp. 544-547. NPL_23.

Yoon et al., 'High-Performance Three-Dimensional On-Chip Inductors Fabricated by Novel Micromahining Technology for RF MMIC', 1999 IEEE MTT-S Int'l Microwave Symposium Digest, vol. 4, Jun. 13-19, 1999, Anaheim, California, pp. 1523-1526. NPL_24.

Yoon et al., 'Monolithic High-Q Overhang Inductors Fabricated on Silicon and Glass Substrates', International Electron Devices Meeting, Washington D.C. (Dec. 1999), pp. 753-756. NPL_25.

Yoon et al., 'Monolithic Integration of 3-D Electroplated Microstructures with Unlimited Number of Levels Using Planarization with a Sacrificial M ET ALlic Mole (PSMm)', Twelfth IEEE Int'l Conf. on Micro Electro mechanical systems, Orlando Florida, Jan. 1999, pp. 624-629. NPL_26.

Yoon et al., 'Multilevel Microstructure Fabrication Using Single-Step 3D Photolithography and Single-Step Electroplating', Proc. of SPIE, vol. 3512, (Sep. 1998), pp. 358-366. NPL_27.

Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.

International Search Report corresponding to PCT/US12/46734 dated Nov. 20, 2012.

Written Opinion corresponding to PCT/US12/46734 dated Nov. 20, 2012.

"Multiplexer/LNA Module using PolyStrata®," GOMACTech-15, Mar. 26, 2015.

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.

B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.

D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.

D. Filipovic, G. Potvin, D. Fontaine, Y. Saito, J.-M. Rollin, Z. Popovic, M. Lukic, K. Vanhille, C. Nichols, "μ-coaxial phased arrays for Ka-Band Communications," Antenna Applications Symposium, Monticello, IL, Sep. 2008, pp. 104-115.

D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular 1/4-coaxial structures for mm-wave applications," Proc. GomacTech., pp. 28-31, San Diego, Mar. 2006.

D. Sherrer, "Improving electronics\ functional density," MICROmanufacturing, May/Jun. 2015, pp. 16-18.

D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.

(56) References Cited

OTHER PUBLICATIONS

E. Cullens, "Microfabricated Broadband Components for Microwave Front Ends," Thesis, 2011.
E. Cullens, K. Vanhille, Z. Popovic, "Miniature bias-tee networks integrated in microcoaxial lines," in Proc. 40th European Microwave Conf., Paris, France, Sep. 2010, pp. 413-416.
E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.
E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.
H. Kazemi, "350mW G-band Medium Power Amplifier Fabricated Through a New Method of 3D-Copper Additive Manufacturing," IEEE 2015.
H. Kazemi, "Ultra-compact G-band 16way Power Splitter/Combiner Module Fabricated Through a New Method of 3D-Copper Additive Manufacturing," IEEE 2015.
H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.
H. Zhou, N. A. Sutton, D. S. Filipovic, "Wideband W-band patch antenna," 5th European Conference on Antennas and Propagation, Rome, Italy, Apr. 2011, pp. 1518-1521.
H. Zhou, N.A. Sutton, D. S. Filipovic, "W-band endfire log periodic dipole array," Proc. IEEE-APS/URSI Symposium, Spokane, WA, Jul. 2011, pp. 1233-1236.
J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.
J. M. Oliver, P. E. Ralston, E. Cullens, L. M. Ranzani, S. Raman, K. Vanhille, "A W-band Micro-coaxial Passive Monopulse Comparator Network with Integrated Cavity-Backed Patch Antenna Array," 2011 IEEE MTT-S Int. Microwave, Symp., Baltimore, MD, Jun. 2011.
J. Mruk, "Wideband Monolithically Integrated Front-End Subsystems and Components," Thesis, 2011.
J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.
J. Oliver, "3D Micromachined Passive Components and Active Circuit Integration for Millimeter-Wave Radar Applications," Thesis, Feb. 10, 2011.
J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves, Sep. 2010, pp. 1-2.
J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.
J. Reid, "PolyStrata Millimeter-wave Tunable Filters," GOMACTech-12, Mar. 22, 2012.
J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.
J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.
J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.
J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.

K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.
K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.
K. Vanhille, "Design and Characterization of Microfabricated Three-Dimensional Millimeter-Wave Components," Thesis, 2007.
K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.
K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.
K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.
L. Ranzani, D. Kuester, K. J. Vanhille, A Boryssenko, E. Grossman, Z. Popovic, "G-Band micro-fabricated frequency-steered arrays with 2°/GHz beam steering," IEEE Trans. on Terahertz Science and Technology, vol. 3, No. 5, Sep. 2013.
L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.
L. Ranzani, I. Ramos, Z. Popovic, D. Maksimovic, "Microfabricated transmission-line transformers with DC isolation," URSI National Radio Science Meeting, Boulder, CO, Jan. 2014.
L. Ranzani, N. Ehsan, Z. Popovit, "G-band frequency-scanned antenna arrays," 2010 IEEE APS-URSI International Symposium, Toronto, Canada, Jul. 2010.
M. Lukic, D. Filipovic, "Modeling of surface roughness effects on the performance of rectangular μ-coaxial lines," Proc. 22nd Ann. Rev. Prog. Applied Comp. Electromag. (ACES), pp. 620-625, Miami, Mar. 2006.
M. Lukic, D. Fontaine, C. Nichols, D. Filipovic, "Surface micromachined Ka-band phased array antenna," Presented at Antenna Applic. Symposium, Monticello, IL, Sep. 2006.
M. Lukic, K. Kim, Y. Lee, Y. Saito, and D. S. Filipovic, "Multiphysics design and performance of a surface micromachined Ka-band cavity backed patch antenna," 2007 SBMO/IEEE Int. Microwave and Optoelectronics Conf., Oct. 2007, pp. 321-324.
M. Lukic, S. Rondineau, Z. Popovic, D. Filipovic, "Modeling of realistic rectangular μ-coaxial lines," IEEE Trans. Microwave Theory Tech., vol. 54, No. 5, pp. 2068-2076, May 2006.
M. V. Lukic, and D. S. Filipovic, "Integrated cavity-backed ka-band phased array antenna," Proc. IEEE-APS/URSI Symposium, Jun. 2007, pp. 133-135.
M. V. Lukic, and D. S. Filipovic, "Modeling of 3-D Surface Roughness Effects With Application to μ-Coaxial Lines," IEEE Trans. Microwave Theory Tech., Mar. 2007, pp. 518-525.
M. V. Lukic, and D. S. Filipovic, "Surface-micromachined dual Ka-and cavity backed patch antenna," IEEE Trans. Antennas Propag., vol. 55, No. 7, pp. 2107-2110, Jul. 2007.
Mruk, J.R., Filipovic, D.S, "Micro-coaxial V-/W-band filters and contiguous diplexers," Microwaves, Antennas & Propagation, IET, Jul. 17 2012, vol. 6, issue 10, pp. 1142-1148.
Mruk, J.R., Saito, Y., Kim, K., Radway, M., Filipovic, D.S.,"Directly fed millimetre-wave two-arm spiral antenna," Electronics Letters, Nov. 25 2010, vol. 46, issue 24, pp. 1585-1587.
N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.
N. Ehsan, "Broadband Microwave Lithographic 3D Components," Thesis, 2009.

(56) References Cited

OTHER PUBLICATIONS

N. Ehsan, K. Vanhille, S. Rondineau, E. Cullens, Z. Popovic, "Broadband Wilkinson Dividers," IEEE Trans. Microwave Theory Tech., Nov. 2009, pp. 2783-2789.
N. Ehsan, K.J. Vanhille, S. Rondineau, Z. Popovic, "Micro-coaxial impedance transformers," IEEE Trans. Microwave Theory Tech., Nov. 2010, pp. 2908-2914.
N. Jastram, "Design of a Wideband Millimeter Wave Micromachined Rotman Lens," IEEE Transactions on Antennas and Propagation, vol. 63, No. 6, Jun. 2015.
N. Jastram, "Wideband Millimeter-Wave Surface Micromachined Tapered Slot Antenna," IEEE Antennas and Wireless Propagation Letters, vol. 13, 2014.
N. Jastram, "Wideband Multibeam Millimeter Wave Arrays," IEEE 2014.
N. Jastram, D. Filipovic, "Monolithically integrated K/Ka array-based direction finding subsystem," Proc. IEEE-APS/URSI Symposium, Chicago, IL, Jul. 2012, pp. 1-2.
N. Jastram, D. S. Filipovic, "Parameter study and design of W-band micromachined tapered slot antenna," Proc. IEEE-APS/URSI Symposium, Orlando, FL, Jul. 2013, pp. 434-435.
N. Jastram, D. S. Filipovic, "PCB-based prototyping of 3-D micromachined RF subsystems," IEEE Trans. Antennas Propag., vol. 62, No. 1, Jan. 2014. pp. 420-429.
N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.
N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.
N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.
N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.
P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.
S. Huettner, "High Performance 3D Micro-Coax Technology," Microwave Journal, Nov. 2013. [online: http://www.microwavejournal.com/articles/21004-high-performance-3d-micro-coax-technology].
S. Huettner, "Transmission lines withstand vibration," Microwaves and RF, Mar. 2011. [online: http://mwrf.com/passive-components/transmission-lines-withstand-vibration].
S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.
S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.
T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].
T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.
T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN-SiC Chip," InterPACK/ICNMM, San Francisco, CA, Jul. 2015.
T.E. Durham, "An 8-40GHz Wideband Instrument for Snow Measurements," Earth Science Technology Forum, Pasadena, CA, Jun. 2011.
Y. Saito, D. Fontaine, J.-M. Rollin, D.S. Filipovic, "Monolithic micro-coaxial power dividers," Electronic Letts., Apr. 2009, pp. 469-470.
Y. Saito, J.R. Mruk, J.-M. Rollin, D.S. Filipovic, "X- through Q-band log-periodic antenna with monolithically integrated u-coaxial impedance transformer/feeder," Electronic Letts. Jul. 2009, pp. 775-776.
Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.
Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.
Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.
Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).
"Shiffman phase shifters designed to work over a 15-45GHz range," phys.org, Mar. 2014. [online: http://phys.org/wire-news/156496085/schiffman-phase-shifters-designed-to-work-over-a-15-45g hz-range.html].
Mruk, J.R., Saito, Y., Kim, K., Radway, M., Filipovic, D.S., "Directly fed millimetre-wave two-arm spiral antenna," Electronics Letters, Nov. 25, 2010, vol. 46 , issue 24, pp. 1585-1587.
"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].
L. Ranzani, N. Ehsan, Z. Popovi‡, "G-band frequency-scanned antenna arrays," 2010 IEEE APS-URSI International Symposium, Toronto, Canada, Jul. 2010.
EPO Extended European Search Report of EP Application No. 12811132.5 dated Feb. 5, 2016.

* cited by examiner

METHODS OF FABRICATING ELECTRONIC AND MECHANICAL STRUCTURES

RELATED APPLICATIONS

This application is a 371 application of International Application No. PCT/US2012/046734 filed Jul. 12, 2012, which claims priority to U.S. Provisional Application No. 61/507,496 filed Jul. 13, 2011. Each of the foregoing applications is hereby incorporated herein by reference.

FIELD OF THE INVENTION

The present invention relates to the fabrication of electronic and/or mechanical structures and components and devices such as those used in the electronics industry. In particular, the present invention relates to using homogeneous or heterogeneous materials in three dimensional fabrication of electronic and/or mechanical structures and components and devices. Additionally, the present invention relates to selective metallization processes including electroless and/or electrolytic metallization.

BACKGROUND OF THE INVENTION

Improved methods of fabricating electronic and/or mechanical structures continue to drive the electronics and other industries. More and more components are being added to devices that are getting increasingly complex and smaller. As a result fabrication techniques are required to provide electronic and/or mechanical components and/or parts that have increased functionality as well as to take up less space in the device and on substrates used in the device. The fields of micro-mechatronics, microsensors such as multi-axis gyroscopes, electrical circuits, and microwave and waveguide circuits are rapidly advancing. The ability to achieve customization in such devices and still allow them to be affordably manufactured has remained a challenge. Most industrial shaping, forming, and production processes achieve economy of scale only by near direct duplication of a device. For example, consumer electronics are affordable when making millions of complex integrated circuits that are nearly identical. Still there are many fields where the ability to make custom 3D parts of heterogeneous materials has remained elusive and substantial sacrifices in dimensional accuracy and precision, material diversity, upward or downward size scaling, for example from microns to meters, and/or other limitations have relegated most direct 3D manufacturing to either be unaffordable, impractical, or find limited fields of use, for example to make plastic prototypes for novelty, engineering understanding, or marketing.

In micromechanics, processes to make small components often revolve around removal rather than additive processes such as turning or milling operations and such devices are typically made one at a time. Alternatively, molding is used but is limited in the complexity of the parts and number that can be made and are usually of limited material diversity. For example, one would not expect injection molding to make parts of plastic, metal, and ceramic in the same molding operation. Processes that have been created to address the fabrication of components and devices of very high precision and accuracy traditionally revolve around photolithographic processes and deposition and/or etching processes. For example, in traditional thin film metallization patterning for integrated circuits and circuit boards, temporary photoresists are patterned on metallic layers followed by etching of the exposed metal, then removed to leave a metallic pattern. Alternatively, metal can be plated into the exposed areas of the photoresist followed by removal of the photoresist and flash etching to leave behind a metallic pattern. Thicknesses of the patterns are limited to the thickness of the original metallic layer, in the case of etching, and the thickness of the photoresist, in the case of metallic plating.

Current fabrication processes include, for example, permanent resists, generally known as photoimageable dielectrics (PID). It may desirable that such materials have low dielectric constants and low dielectric losses particularly when they are a permanent part of an electronic component and/or device. They are coated onto a substrate from either a liquid composition or by using a dry film, indiscriminately, coating the entire substrate. They can be used to photodefine structures wherein the PID can be cured to become a permanent part of the electronic and/or mechanical component and/or device. Adhesion promotion and catalyzation of the surfaces of the cured PID may allow for metal to be deposited onto the surfaces of the resist.

In some processes, a temporary photoresist may be metallized or the resist may serve as a mold for the metallization; this is followed by removal of the resist leaving behind a metal structure with air as the dielectric. In addition, many structures require more than one layer of dielectric material and/or conductive materials such as, for example, metal. To create devices that have substantial complexity, tens, hundreds, or even millions of layers may be required depending on the size, scale, and resolution desired. Furthermore, the use of PIDs to create such devices is very limiting. After a layer of PID is imaged to form a structure, a second layer, uniformly applied from either a liquid or a dry film, has difficulty planarizing or filling the spaces in the structure particularly if they are on the scale of the layer's thickness or greater. A further limitation is the inability to create structures of varying and specific desired thicknesses since the PID can only be applied as one uniform thickness when applied by these methods. Still a further limitation is the inability of the PID to allow for selective metallization. Adhesion promotion and catalyzation of the PID surfaces is non-selective so that every exposed surface will be metallized, rather than a select set of surfaces.

A still further limitation of the current techniques is the inability to create structures that differ substantially in size, functionality, and accuracy and also can provide the needed material diversity wherein the materials have both acceptable properties in comparison to other forming techniques currently known—for example finding a process that can provide the properties of metals, dielectrics, and some polymer materials that can be achieved through means such as thin film deposition, plating, sintering, and so on. Even without material diversity, the materials available in the 3D printing processes themselves often have compromised material properties compared to the material available in bulk or through other forming methods. This is particularly true when attempting to create multicomponent structures in the 3D printing process. For example, the properties of a 3D printed conductor or metallization may have unacceptably low electrical or thermal conductivity compared to a vacuum deposited or plated counterpart. For a dielectric such as a ceramic, or even a polymer composition, properties such as the dielectric constants, dielectric losses, and density may be unacceptably compromised. Thus, it may prove unacceptably challenging to obtain a suitable diversity of desirable materials, having a large enough set of desirable material properties, to create many functional devices that would be desired, for example, that which would desirably be associated with creating a 3D printed and fully functional version of many components populating an electronic and/or mechanical device. For instance, to create a circuit board, both a good electrical conductor and a good non conductor are required in a pattern. It may also be important in the final device that its metals or conductors are able to take a solder based device attachment; and that its adjacent non-conductors can withstand the temperatures associated with this process. Finding a 3D printing process that can provide metal properties found in plated metals and in the same process finding a dielectric that will both suitably adhere to said printed metal and have an acceptable decomposition temperature, chemical resistance, and other suitable dielectric properties can be difficult with the processes currently available in 3D printing.

The current processes are of little use when a substrate has components or other elements already fabricated onto or into the substrate particularly where the topology is substantially non-planar with respect to the layer thickness. Also, many substrates are sensitive to the solvents or heating steps that are required in fabrication. Alternative methods of preparing these devices with many components include molds and pick and place processes wherein the components are made "off-line" and are assembled later onto the electronic and/or mechanical device. Classic examples include capacitors and resistors, and inductors as well as magnetic components.

As can be seen, current methods for the fabrication of electronic and mechanical structures for manufacturing electronic and/or mechanical components and other objects are limiting. Thus, there is a need for devices and methods of fabrication that allow electronic and/or mechanical structures to be made with varying sizes, thicknesses, and materials as well as the ability to be preferentially metallized—including devices and methods that can be utilized in a non-destructive manner when substrates are already populated with devices.

SUMMARY OF THE INVENTION

In a first embodiment, the present application for patent discloses and claims a method of fabricating three dimensional electronic and/or mechanical structures by selectively depositing at least one dielectric material, which comprises a metallizable composition, using three dimensional printing methods and selectively depositing metal onto the metallizable dielectric material. The deposited dielectric material, which comprises a metallization composition, may further be made from a photoimageable composition and/or patterned using lithographic processes such as, for example, contact printing, projection printing, direct write printing, and/or other lithographic processes.

In a second embodiment, the present application for patent discloses and claims a method of fabricating three dimensional electronic and/or mechanical structures by selectively depositing at least one dielectric material, which comprises a metallization composition, using three dimensional printing methods and depositing at least one dielectric material which does not comprise a metallization composition and selectively depositing a metal onto the metallizable dielectric material.

In a third embodiment, the present application for patent discloses and claims a method of fabricating three dimensional electronic and/or mechanical structures as in either of the previous two embodiments but further comprising depositing a sacrificial material comprising a metallizable composition, selectively metallizing the sacrificial material and removing the sacrificial material. The sacrificial material may be comprised of a photoimageable material that can be lithographically imaged using lithographic processes such as, for example, contact printing, projection printing, direct write printing, and/or other lithographic processes. The removal of the sacrificial material may be performed by organic solvents, aqueous solvents and/or thermal vaporization and optionally may include mechanical assistance such as, for example, ultrasonification.

In a further embodiment, the present application for patent discloses and claims a method of fabricating three dimensional electronic and/or mechanical structures by selectively depositing one dielectric material using three dimensional printing methods, selectively depositing a second dielectric material using three dimensional printing methods, selectively catalyzing one of the dielectric materials with a plating catalyst and selectively depositing metal onto the catalyzed dielectric materials. Either, or both, of the dielectric materials may be photoimageable and can be imaged using lithographic processes such as, for example, contact printing, projection printing, direct write printing, and/or other lithographic processes.

In a further embodiment, the present application for patent discloses and claims a method of fabricating three dimensional electronic and/or mechanical structures of the immediately above embodiment, but further comprising depositing a sacrificial material comprising a metallizable composition, selectively metallizing the sacrificial material, and removing the sacrificial material. The sacrificial material may be comprised of a photoimageable material and can be imaged using lithographic processes such as, for example, contact printing, projection printing, direct write printing, and/or other lithographic processes. The removal of the sacrificial material may be performed by organic solvents, aqueous solvents and/or thermal vaporization and optionally may include mechanical assistance such as, for example, ultrasonification.

In still a further embodiment, all of the above embodiments are deposited in a selected plurality of layers to give a sequential build of electronic and/or mechanical structures, wherein the layers comprise one or more of a metal material, a sacrificial material, and a dielectric material thereby forming a structure above the substrate.

In the above embodiments, the three dimensional printing methods can be, for example, stereolithography, 2-photon stereolithography, inkjet, hot melt extrusion fabrication, and/or selective laser sintering.

All of these embodiments and their variants may have in common the use of a dielectric that is selectively metallizable in conjunction and relation with a second dielectric to form mixed metal-dielectric structures and metal-dielectric-void structures.

BRIEF DESCRIPTION OF THE DRAWINGS

The foregoing summary and the following detailed description of the exemplary embodiments of the present invention may be further understood when read in conjunction with the appended drawings, in which:

FIG. 1A, schematically illustrates two different printing heads 10, 11 printing two different materials 12, 13 to provide first and second structures 14, 15 on a substrate 16;

FIG. 1B schematically illustrates the case where a metal 17 is further selectively deposited onto the second structure 15 of FIG. 1A;

FIG. 1C schematically illustrates inkjet printing of a second structure 25 in a manner similar to that of FIG. 1A but onto a metal layer 20 rather than directly onto the substrate;

FIG. 1D schematically illustrates the case where a metal 22 is further deposited onto the second structure 25 of FIG. 1C;

FIG. 1E schematically illustrates the case where the inkjet deposited material of the second structure 25 of FIG. 1D has been removed to leave a standalone metal structure 28;

FIGS. 1F and 1G schematically illustrate a method and resulting structure similar to that of FIGS. 1C-1D but having a sacrificial material 18 disposed on the second structure 25 preventing metallization at the location of the sacrificial material to provide a release hole to assist in the removal of the second structure 25 after metallization;

DETAILED DESCRIPTION OF THE INVENTION

Figure 1A:
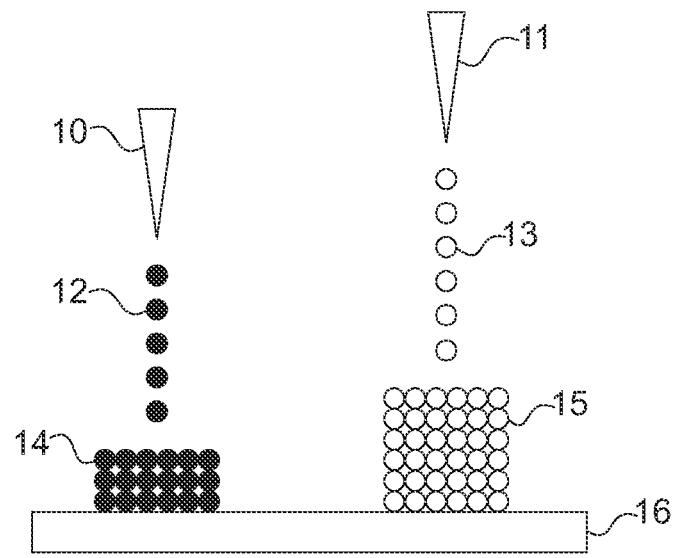
FIGS. 1A-1G schematically illustrate exemplary processes, devices, and materials in accordance with the present invention exemplified by ink jet printing or other material dispenser as but one illustrative example of 3D-printing processes of the present invention.

The present invention relates to processes and devices created, at least in part, utilizing three dimensional (3D) additive build manufacturing as a way to create 3D objects by going from a computer or digital design of the 3D object to the object itself from this digital information. In one of its aspects, the present invention relates to simple and complex electronic and/or mechanical structures and processes for their formation. In one notable aspect, the present invention relates to devices having conductive structures with tolerances and accuracy on the micron scale, such as microwave and waveguide circuits. In this regard, the present invention provides novel methods for creating such conductive structures via 3D additive build manufacturing while overcoming present difficulties in providing conductive structures of small dimension and high tolerance and having suitable bulk electrical and thermal conductivity properties made via 3D additive build manufacturing. In particular, the present invention may use selective metallization processes and materials in conjunction with non-conductive structure(s) provided by 3D additive build processes described below to provide micron scale accuracy conductive structures within a multi-structure and/or multi-component device environment, for example. As used herein, "selective metallization" connotes the ability for one material to take or bind to a metallization process or to a metallization catalyst with respect to a second material which does not so take or bind when both are exposed to the same metallization process. Thus, selective metallization permits selected structures to be metallized while other structures within the overall device/system architecture are not. A number of motivations for this selectivity have been discovered.

One motivation is that some of the highest accuracy and tolerance 3D printing methods such as stereolithography tend to be formed from light solidified monomers or polymers. Even if one used electrically conductive polymers however, they are not typically able to provide bulk conductivity of a dense metal such as silver or copper. While it is possible to coat most plastic surfaces with a metal—for example by electroless plating—it is not possible to use current techniques with precision to choose where metal will and will not be coated except in the case of a planar and smooth exterior of sufficient dimensions, for example with additional masking. Thus, in accordance with the present invention the desirability of having a deposited material with near bulk-conductivity grow and adhere where desired, or through other means such as later stage thermal processing, is recognized.

Turning to the different technologies available for performing additive manufacturing or 3D printing, 3D additive build manufacturing has come to include additive manufacturing methods such as Selective Laser Sintering (SLS), and StereoLithography (SLA), and micro-stereolithography. Other additive manufacturing methods include Laminated Object Manufacturing (LOM), Fused Deposition Modeling (FDM), and MultiJet Modeling (MJM), and Inkjet. Areas of substantial overlap can exist between many of these methods, which can be chosen as needed based on the materials, tolerances, size, quantity, accuracy, cost structure, critical dimensions, and other parameters defined by the requirements of the object or objects to be made. In addition, 3D additive build manufacturing has come to be known by a variety of names, including 3D printing, for example. Thus, as used herein the terms "3D additive build manufacturing" and "3D printing" are used interchangeably.

Three dimensional (3D) printing is a form of additive fabrication or additive manufacturing technology wherein a 3D object is created by laying down or forming successive layers of material at precise positions. Thus inkjet, fused deposition, and multijet would all be forms of 3D printing. 3D printers have the ability to print structures made of several materials with different mechanical and/or physical properties in a single build process, and operate by taking a 3D computer file and constructing from it a series of cross-sections taken in the build direction. Each cross-section layer is then printed one on top of the other to create the 3D objects. (When the term "layer" is used herein, it means one or more levels or of potentially patterned strata and not necessarily a continuous plane.)

Alternatively, a 3D printer can create a 3D object from an extrusion of a liquid that is solidified by either a change in temperature or a chemical change, for example, such as melting or polymerization. Thus, while a layer-wise build may be used in some instances, a vector-based build where 3D motions both in and out of a plane are determined based on the part to be made, machine physics, material chemistry, and other manufacturing considerations can also be used. In plane rastering and out of plane motion of a "print head" supplying a material, or for the same "print head", adjusting the 3D coordinates of a critical focal volume of light within a photosensitive liquid and (thereby converting it in that location to a solid "voxel") are both methods where, through motion and repetition, a 3D object of some target physical dimensions, shape, and size can be formed.

A number of different technologies are available for performing 3D printing. Their main differences are in the way layers are built to create objects. Some methods use melting or reflow to produce the layers such as in "selective laser sintering" wherein one or more lasers selectively fuse particles from a bed of particles. After each cross-section is created, a new layer of powder is applied to the top and the processes repeated until a desired 3D structure is obtained. Depending on desired properties, each layer of powder may be the same, or a layer of different powder may be applied. Each powder layer may be uniform or the layer can be sectioned with differing materials, thus providing the capability of obtaining objects with differing characteristics and/or functionalities. This technique is also useful for producing fused plastic layers and/or plastic objects or metal layers and/or metal objects or ceramic layers and/or ceramic objects. For metallic structures, a bed of metallic powder is provided followed by exposure to a laser. For many functional objects in electronics and in mechanics, a combination of materials that include more than one of metal, ceramic, plastic, semiconductor, and others would be desirable. Thus it is desirable in such a process to control factors such as stress, shrinkage, CTE, material cohesion and inter-material interface adhesion in constructing or building such a 3D device of highly heterogeneous material types.

Another method in additive manufacturing through 3D printing is "hot melt extrusion fabrication" wherein materials, supplied as pellets and/or a filament may be liquefied and deposited by one or more extrusion heads. The pellets and/or filaments may be the same or different and may be melted and mixed prior to or during extrusion.

Other methods include application of liquid materials that are cured with different technologies, including inkjet printing. In the case of 3D structures, the "inkjet" may deposit layers, for example, from a micron to tens of microns or more in thickness in each layer. The layer may be cured as the process proceeds, for example, by drying. Alternatively, in one part, inkjet printing layers can be applied and cured one layer at a time. One or more printing heads, using similar or different materials, can be used to build structures on a substrate. Another inkjet printing technique is to inkjet a binder onto a bed of powder to bind the powder into a solid layer. The process continues until the desired 3D object is obtained.

Another method of additive manufacturing using liquid materials is stereolithography wherein a vat or layer of liquid polymer is exposed to a light. The exposed regions of liquid polymer harden into solid layers. The substrate upon which the solid layer region was fabricated is then moved down in small increments and the liquid polymer is again exposed to light. The process repeats until the model is built. The liquid polymer is then drained from the vat, leaving the solid model. This method also allows for replacing the liquid polymer with a different liquid polymer at various stages during the building process, thus allowing for the use of different materials for different applications and with different properties.

Other techniques include 2-photon stereolithography in which a 3D structure is obtained using one focused laser to create a 3D gel. This is followed by a second laser that cures the desired sections of the gel into a solid, with the uncured gel being washed away.

Materials useful for the 3D fabrication of electronic and/or mechanical structures, include, but are not limited to, dielectric materials, for example, ABS, polyacrylates, BCB, polyimides, polyamides, polyurethanes, polyesters, polycarbonates, polysulfones, polysilicon materials and other materials known in the art to be useful as dielectric for fabrication of electronic and/or mechanical structures. While polymers may be most easily deposited materials using current 3D printing techniques, semiconductors, ceramics, and metals are typically found in electronic components. Selective laser sintering is one of the only additive manufacturing techniques that currently provides near bulk density metals, however its accuracy and resolution are low compared to jet deposited or extrusion deposited 3D printers. These materials however can be 3D printed as a mixture such as a nanomaterial paste or composition in a binder. 3D printing techniques that have a direct thermal component such as laser sintering can often provide a final structural material; however, other approaches such as baking the final printed structure to remove binders and certain polymer components could be equally used to obtain the final desired material properties. For instance, a polymer could be heat treated to remove solvent and leave behind a solid, or a polymer-ceramic composite could be heat treated to decompose the polymer and leave behind a ceramic. The materials may be used alone or may be formulated into inkjet compositions, or as meltable solids for hot melt extrusion application, or as monomeric, polymeric, or mixtures of materials for stereolithographic applications.

Other useful materials may be applied by additive manufacturing or 3D printing processes and further processed in a curing step, for example, epoxy, novolac, melamine, glycidyl ethers of poly-bis-phenol A, or combinations thereof, and other crosslinking systems which require a thermal cure, a photo cure or a combination thereof. In some of these materials, one or more curing catalysts aid in the curing step, for example, photoacid generators, thermal acid generators, photobase generators and/or thermal base generators. Depending on the desired properties the materials for 3D printing may be combined into one or more useful printing compositions.

In some embodiments, the compositions for 3D printing or additive manufacturing comprise a "metallizable composition". These compositions may contain or may selectively bind to metallization catalysts, which allow for the deposition of metal using wet chemical processes or gas phase processes. Metallization catalysts include, for example, palladium-tin alloys which are activated to palladium catalyst during processing. Other catalysts include organic palladium materials which may be activated to palladium catalyst by thermal or chemical or plasma treatment. In some cases, a metallization precursor may be included in the dielectric being deposited. In some cases a material is chosen that can readily adsorb or absorb or bind to a catalyst from a solution in relation to a second material that does not absorb or adsorb or bind to the catalyst. In this embodiment, the material is deposited, the material may optionally be etched and may be optionally exposed to an additional step to concentrate the catalyst such as a plasma etching step that selectively removes a small amount of the polymer or binder material and leaves the catalyst. Further processing needed to activate a catalyst such as a palladium chloride composition, like exposure to a reducing agent, is known in the art. The material can then be plated.

In other embodiments, the printing compositions may comprise photoimageable materials. For example, a photodefinable dielectric material, for example, glycidyl ethers of poly-bis-phenol A/photoacid generator systems, can be applied by 3D methods followed by further processing using photolithographic techniques such as, for example, exposing the material to actinic radiation through a photomask and removing any unexposed material using a suitable developer solution. This method could allow a two-fold patterning process, the first being the pattern provided by the 3D deposition, the second being a photolithographic process, and may provide more versatility in manufacturing a 3D structure. Other photolithographic materials may also be used for example, acrylate systems, BCB systems, silicon based systems and/or novolac systems.

Using, for example, electroless metallization processes known in the art, metal may selectively be deposited, for example, copper, nickel, gold, tin, zinc, silver, palladium, tin, lead, aluminum, chromium and/or alloys. In some embodiments, the composition containing the metallization catalyst has its surface etched back to remove some of the non-catalytic dielectric material, thereby increasing the number of catalyst sites in the surface of the composition potentially allowing for improved plating. For example, etching steps to concentrate catalysts on a surface of the metallizable plastic may include plasma processes such as, for example, plasma etching in the presence of oxygen or may include wet chemical etching.

Other dielectric materials not containing metal catalysts may be deposited along with catalyzed dielectrics. These can be deposited at the same time when using inkjet or hot melt extrusion printing by employing more than one printing head and/or sequentially such as, for example, with stereolithography where in one material is deposited from a liquid composition, the composition flushed and replaced by a second liquid composition which is then deposited. This allows for selective metallization wherein selected structures are metallized while other structures are not.

To date, entire 3D printed plastic models have been metalized using plating on plastic techniques such as electroless plating and/or electroless plating followed by electrolytic plating; however, methods to selectively enable the formation of metalized regions along with non-metalized regions wherein the regions that become metal are defined by the materials deposited have not been demonstrated. This is in contrast with a patterned metallization in which an additional masking material such a resist or paint is applied to the object to create a metal pattern. In other embodiments, two dielectric compositions may be deposited onto a substrate using 3D printing methods, wherein only one of the dielectric compositions can be catalyzed with a plating catalyst and subsequently plated and the other does not take to or have the catalyst incorporated and so does not plate in the same metallization process. One way this can be achieved when one of the dielectric compositions has surface characteristics that allow a plating catalyst to adhere to it, while the other dielectric composition does not allow the catalyst to adhere. Examples of such adherent surfaces include surfaces with, for example, carboxylic acid, hydroxy and/or other highly polar groups on the surface and/or the surface may be porous allowing catalyst to be captured in the pores.

Alternatively, one of the dielectric compositions may be treated with conventional plating on plastic processes, for example, slight swelling and etching of the dielectric followed by contact with a catalyst bath where the catalyst becomes adherent to the dielectric. The treated dielectric then is plated in a plating bath. The other deposited dielectric is selected such that it is not affected by the catalyzing and therefore the plating processes. Plating of the selected dielectric may be performed for example by electroless plating processes and/or by a combination of electroless plating followed by electrolytic plating, for example. In the above plating processes, it can be seen that the embodiments of the current disclosure provide for select plating and non-plating of the deposited 3D structure.

The selective metallization may also occur by a gas or vapor phase reaction, for example in atomic layer deposition (ALD), a polar material may allow a series of gas phase reactions that metalize a surface were as a non-polar material may not start a reaction.

In addition to 3D printing or additive manufacturing of permanent dielectric materials, metallizable or otherwise, the present invention includes the 3D printing of sacrificial materials along with one or more of the metallizable dielectric and the non-metallizable dielectric. For example, the 3D printed materials may be used to provide both a sacrificial scaffolding, for example, a starch, and a permanent material, for example, ABS. In this case, the final object is obtained when the sacrificial scaffolding is dissolved or otherwise removed. While parts entirely made of dielectric materials are useful in certain applications, other products, especially electronic and/or mechanical structures, benefit from having a mixture of metal and dielectrics available which may be combined with nearly arbitrary complexity, particularly when combined with a sacrificial material that can provide a space or void where desired.

Thus typically three materials may be used, a sacrificial scaffolding material that can be dissolved after printing, and two materials one selectively metallizable in reference to the second, which remain intact during the process which removes the sacrificial scaffolding material. Subsequently, the metallizable material may be metallized during a metallization step, after which the selectively metallized material may optionally be removed in a second removal step. If the material is optionally removed, it may be desirable to ensure the metal is deposited to a thickness such that it can be free-standing. In some cases it may be desirable to have a dielectric, a metal, and a void structured in arbitrary and determined complexity in the final structure. Merely coating a dielectric, such as a selectively metallizable plastic, with a metal coating may not be desirable. A metal encapsulated dielectric may for example fail under temperature cycles due to a mismatch between the metal and dielectric properties, and therefore one may prefer to remove the metallized dielectric from the metal coating, similar to the removal of sacrificial materials that can serve as scaffolding. Thus one may choose 3 or 4 materials to realize such a device: a selectively metallizable dielectric, a second dielectric that does not become metallized in the same process, the metal that becomes coated on the metallizable dielectric, and optionally a scaffolding material. Typically, the scaffolding material is removed, then metal is deposited selectively on one of the two dielectric materials, and then the metallized dielectric material may also be optionally removed by a final removal process, leaving a desired metal, air, dielectric structure.

Materials suitable as sacrificial materials can be printed using 3D techniques. Such materials are platable using the techniques described above, that is, they contain plating catalysts and/or can be swell/etched/catalyzed, and/or can be readily removed to leave behind a full or partial metallic structural element. Such materials include, for example, polyacrylates, polycarbonates, cellulosic materials, and other materials capable of being removed by a remover. Removers include organic solvents, for example, glycol ethers, glycol ether acetates, alcohols, esters, ethers, ketones, halogenated solvents, DMF, DMSO and the like; aqueous solvents such as acids and bases ranging in pH from about 0 to about 13 with or without surfactants and/or emulsifiers; and/or thermal vaporization, and/or combinations thereof. The sacrificial materials may dissolve, emulsify, particulate, depolymerize, and/or become gaseous. Additionally, mechanical assistance, for example ultrasonification, may also be used. The selectivity of the removers and the removal process require that the dielectric materials are not affected during the removal process.

The current application also discloses depositing metalizable dielectrics, non-metalizable dielectric materials and sacrificial materials in a plurality of layers. The versatility of 3D printing allows a deposition of a variety of sequences of layers based on the electronic and/or mechanical structural requirements. For example, 3D-MERFS and PolyStrata®-like devices can be prepared by the disclosed methods. See U.S. Pat. No. 7,012,489, U.S. Pat. No. 7,649,432, U.S. Pat. No. 7,948,335, U.S. Pat. No. 7,148,772, U.S. Pat. No. 7,405,638, U.S. Pat. No. 7,656,256, U.S. Pat. No. 7,755,174, U.S. Pat. No. 7,898,356, U.S. Pat. No. 8,031,037, US 2008/0199656 and US2011/0123783, 2010/0296252, 2011/0273241, 2011/0181376, 2011/0210807 for examples of devices that can be prepared using the currently disclosed methods, the contents of which patents and published applications are incorporated herein by reference.

In some embodiments, materials can be mixed in a reservoir prior to the printing of the material. This is particularly useful for materials that are highly reactive so that two materials may start to react with each other as they are being printed. In this manner, viscosity can build up quickly to help form a solid layer when the layer is applied.

Two printing devices may work in concert with each other so that two parts of highly reactive materials can be printed simultaneously and begin reacting immediately, such as, for example, an epoxy novolac layer is printed from one printing device and an acid is printed by a second printing device directly onto the epoxy novolac layer. As soon as the acid comes into contact with the epoxy, a crosslinking reaction occurs.

In other processes, some layers can be cured by heat and/or light, so that some of the printing heads can be replaced by or used in conjunction with heating elements and/or light emitting elements which may be applied to a layer which has been deposited. In this manner, the layers may be selectively cured or allowed to remain uncured, suitable for further processing.

The electronic and/or mechanical structure may be deposited on a variety of different surfaces since the process is not dependent on coating processes that are typically required. Thus, a planar or nonplanar surface may be used to deposit the layers. Surfaces which are partially or fully populated with electronic devices and/or components may also be used and fabrication can take place on these surfaces, which is difficult to achieve with current conventional methods.

The method for building electronic and/or mechanical structures may include depositing materials using conventional deposition processes, including, for example, spin coating, lamination, dip coating, curtain coating, slot coating, spray coating, off-set coating and the like. It may be desirable to planarize the structures after every layer or periodically, or provide selective removal steps during the processing of one or more layers. To that end, other conventional processes may also be included, for example, chemical-mechanical-polishing, lapping, mechanical machining, diamond turning or other precision turning, milling, grinding, plasma etching, laser ablation, and/or combinations thereof.

The 3D printing process can provide structures of different shapes and/or different heights, as well as structures that have cavities and/or walls into which discrete components may be placed later during manufacturing.

The current application for patent is not restricted to size such that objects from microns to meters can be fabricated using these methods and is primarily only limited by the resolution capabilities of the print head or the scale of the printer. Additionally, the substrate used for deposition may function only as a support onto which the objects, and all its embodiments, are printed, such that the substrate may later be removed providing a stand-alone object with selectively metallized portions on the object.

Turning now to FIG. 1A, as an illustrative example of 3D-printing processes of the present invention, printing heads 10, 11 are provided which may deposit droplets of first and second materials 12, 13 to form first and second layered structures 14, 15 on a substrate 16. As used herein, the term "droplets" may refer to liquids, solids, e.g., powders or nanoparticles, or combinations thereof, such as a suspension or slurry, for example. "Droplets" may be of a volume of picoliters to milliliters depending on the dimensional size, tolerances, and complexity of the device being fabricated. The first and second materials 12, 13 may have the same or different composition, and the printing heads 10, 11 may be the same or different, depositing different sizes and/or shapes of droplets as desired. Although FIG. 1A illustrates two printing heads 10, 11, more than two printing heads may be used, each of which may deposit materials simultaneously and/or sequentially. In addition, a single printing head 10 may be used to deposit each of the first and second materials 12, 13. The printing heads 10, 11 and the substrate 16 are typically moved relative to one another using linear motors, gantry robotic systems, SCARA robotic systems, electrostatic deflection of the particles, raster scan printing motion, or other relevant techniques, for example.

The printing heads 10, 11 may deposit layer upon layer until a desired thickness of structure is obtained. In some processes, the printing heads 10, 11 may provide multiple materials by switching from one material to another during the process, and differing ones of the multiple materials may be printed over each other to provide complex patterns. When layers are printed over each other, openings may be left in the layers to allow solution flow into and out of the structure formed of the layers.

The substrate 16 may comprise any surface useful in forming an electronic and/or mechanical device including, for example, silicon materials, ceramic materials, glass materials, metal materials, integrated circuit containing semiconductor materials, circuit board materials, RFID substrates and the like. It may for example be a SiGe or InP wafer containing integrated circuits. The substrate 16 may be flat or, because of the versatility of the process, may be populated with components and/or structures that are already resident on the substrate 16. The substrate 16 may be a permanent part of the end product or it may be a temporary platform on which the structures are grown and/or removed and/or detached using, for example, a sacrificial layer.

Figure 1B:
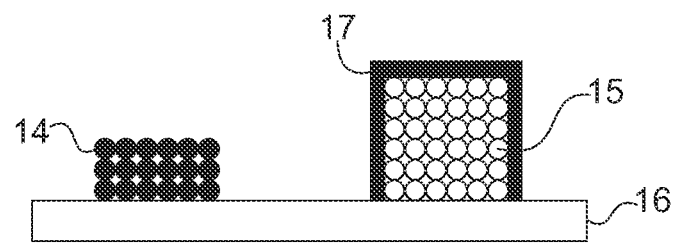

FIG. 1B illustrates the selective metallization of the second layered structure 15 with a metal coating 17, which can be achieved by electroless plating techniques, electrolytic techniques and/or direct plating, for example. In some applications, one or more of the materials 12, 13 may contain conductive polymers such as, for example, polythiophene, polypyrrole and/or polyaniline. Conductive materials may also include, for example, graphene, carbon, nanocarbon constructions and/or other materials, including nonmetals, which may be useful as electroplating conductors.

Alternatively or additionally, one of the materials, e.g., material 13, may contain plating catalysts. The catalysts may include one or more of palladium/tin colloid and/or their chloride salts, for example. After the printing process is complete (e.g., FIG. 1A), the substrate 16 containing layered structures 14, 15 may be immersed in a commercial activating solution which for example reduces a tin salt or palladium salt to elemental palladium and/or tin in the optionally catalyst-containing second material 13. The substrate 16 may then be immersed in a commercial electroless plating bath and operated to obtain a desired metal thickness. In some embodiments, it may be advantageous to etch the surfaces of the catalyst-containing second material 13, allowing more of the catalyst to be on the surface for contact and reaction with the electroless plating materials. Etching can be performed in liquid baths such as, for example, strong alkali materials which have some sensitivity to strong alkali, or the materials may be plasma etched for example in an oxygen containing plasma as described above.

Figure 1C:
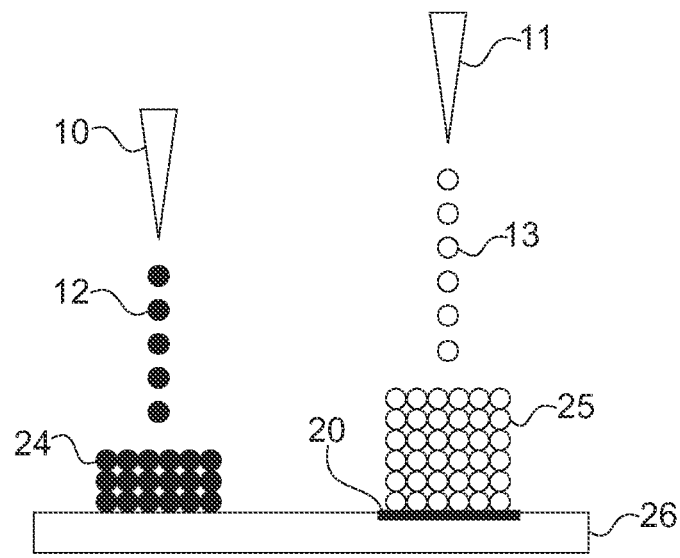
Figure 1D:
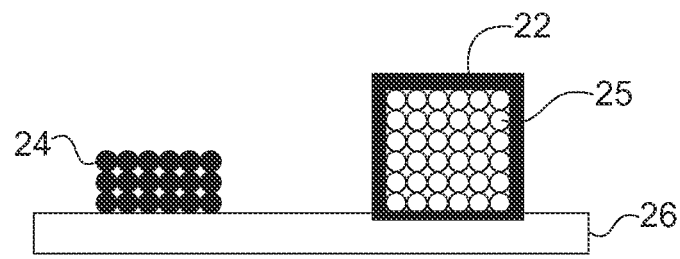

Turning to a further exemplary structure and method of the present invention, FIG. 1C illustrates a process similar to that of FIG. 1A in which printing heads 10, 11 deposit droplets of first and second materials 12, 13 to form first and second layered structures 24, 25 on a substrate 26; however, a metal layer 20 is provided on the substrate 26 at the location in which the second structure 25 is to be deposited. A metal 22 may be further deposited to the exposed surfaces of the second structure 25, in a similar manner described above with regard to the metal 17 of FIG. 1B, allowing the second structure 25 to be completely surrounded by metal 22, FIG. 1D. Subsequently, the second deposited material 13 comprising the second structure 25 may be removed to leave a stand-alone, 3D metal structure 28, FIG. 1E. As described above, the deposited second material 13 may be removed by one or more of dissolution, thermal vaporization, polymer deconstruction, and other suitable methods. The dissolution of the second structure 25 may be enhanced by printing an additional sacrificial material 18 over a portion of the second structure 25 so that a selected region of the second structure 25 is not metallized to form a "release hole", FIGS. 1F, 1G. This additional sacrificial material 18 may be stripped selectively revealing an unmetallized region of the second structure 25 which may then be dissolved and/or otherwise removed from the metal shell 29. The additional sacrificial material 18 may be the same or different from a sacrificial material 25 and/or may be a thin layer of a dielectric that selectively does not metallize under the conditions of second structure 25. The next step from FIG. 1G then would be for it to look similar to FIG. 1E if the option to remove the materials of 18 and 25 is chosen.

Figure 1E:
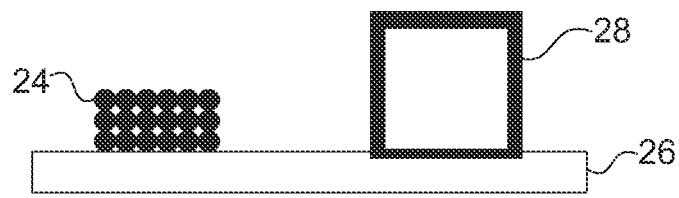
Figure 1F:
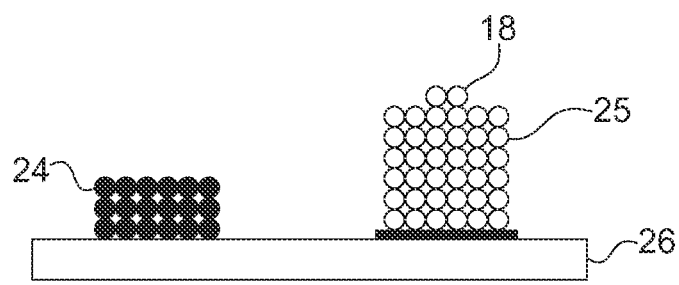
Figure 1G:
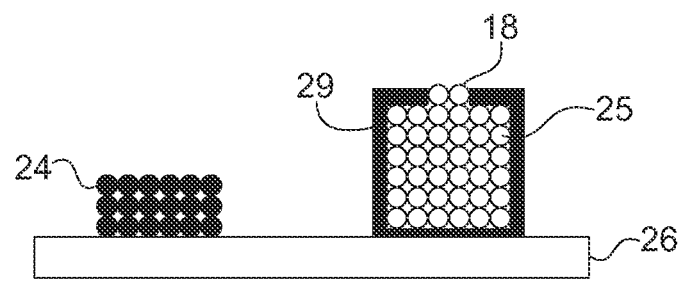

As mentioned, materials which are suitable for depositing can range from dielectric materials such as, for example, polyimides, polysulphones, polysilanes, and the like, as well as polyacrylates. Depending on the desired structure of the fabricated electronic and/or mechanical device, temporary materials may also be used such as, for example, waxes, solvent soluble materials and/or aqueous solution soluble materials. These materials can be important when the final fabricated device has air gaps or voids as shown in FIG. 1E.

Figure 2:
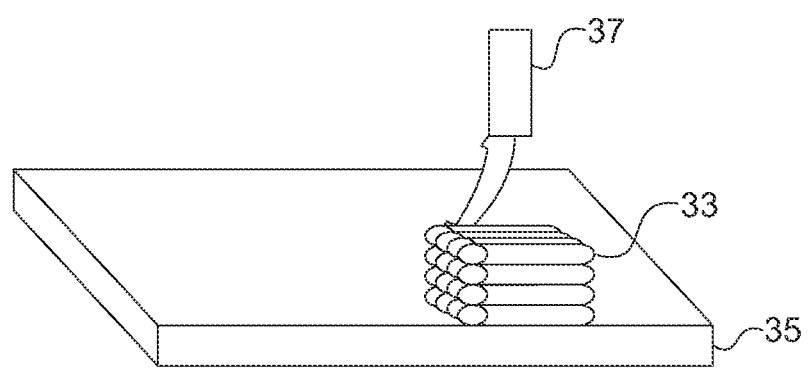
FIG. 2 schematically illustrates using hot melt extrusion fabrication as an illustrative example of 3D-printing processes, devices, and materials of the present invention, wherein a printing head 30 deposits material 33 onto substrate 35.

FIG. 2 illustrates another exemplary process for depositing materials for electronic and/or mechanical structures using hot melt extrusion fabrication techniques wherein a printing head 37 deposits material 33 onto substrate 35. As with the inkjet printing technique discussed above, there may be more than one printing head depositing more than one material at the same time or at different times. The material that feeds into the printing head may be changed during the process to allow deposition of different materials from the same printing head. Alternatively or additionally, multiple print heads containing different materials may be used in sequence or in parallel. In this process, materials are pre-heated, and/or may be premixed with other materials prior to deposition.

Figure 3:
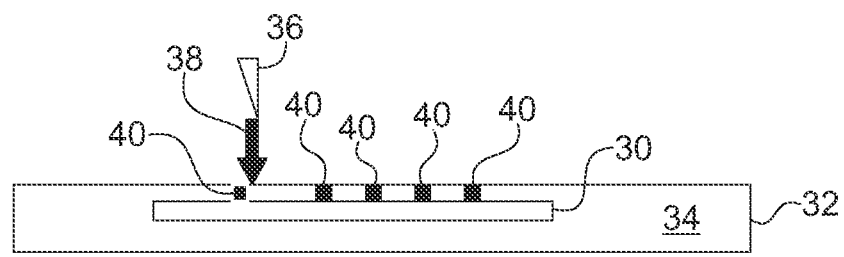
FIG. 3 schematically illustrates an exemplary process of stereolithography as an illustrative example of 3D-printing processes, devices, and materials of the present invention, in which a substrate 30 is placed in a bath 32 containing a liquid monomer 34 and an exposure device 36 exposes the monomer to curing radiation 38 to give cured structures 40 which steps may be repeated many times to create a 3D structure.

FIG. 3 illustrates stereolithography as a further exemplary process for creation of 3D structures of the present invention. A substrate 30 is placed in a bath 32 containing a curable material, such as a liquid monomer or liquid polymer 34. An exposure device 36 exposes the monomer to curing radiation 38, which may be, for example, ultraviolet radiation to provide a cured layer pattern 40 at selected locations on the substrate 30. After the layer pattern 40 is deposited, the substrate 30 may be submerged further into the bath 32 to a chosen level, and a new liquid layer cured on top of the substrate 30 and/or portions of the existing layer pattern 40. The exposure may be repeated with each new layer adhering to previous layers 40, and the substrate 30 again submerged further into the bath 32. The process may continue until the desired 3D structure is created. The liquid monomer 34 may be drained and replaced with a different material during the process allowing for the use of more than one type of material for the building of the structure. Additionally, there may be more than one exposure unit 36 exposing the liquid monomer 34 at the same or different times.

Figure 16:
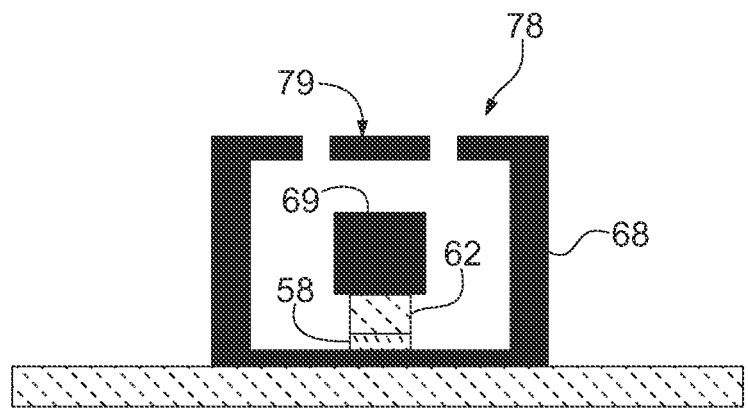

Turning now to FIGS. 4-16, an exemplary process of the present invention is illustrated using an inkjet process as an example of a 3D additive build process of the present invention in the fabrication of a three dimensional, multi-layered, coax cable 78, FIG. 16. It is to be understood that other suitable 3D manufacturing techniques may also be used instead or in combination, but inkjet printing has been shown merely for purposes of illustration and not limitation.

Figure 4:
FIGS. 4-16 schematically illustrate cross-sectional views of an exemplary 3D printing process and structure in accordance with the present invention for the fabrication of a three dimensional, multilayered, coaxial cable.
Figure 5:
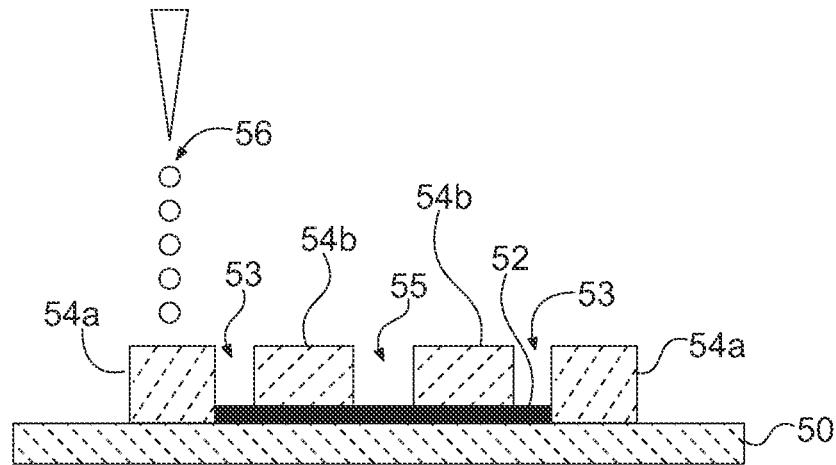
Figure 6:
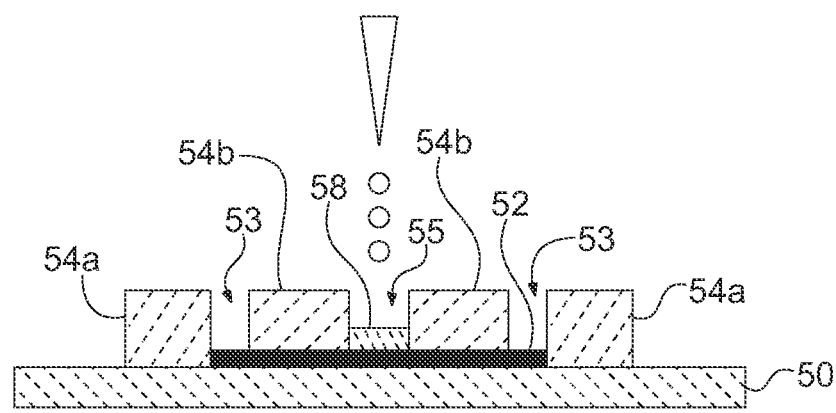
Figure 7:
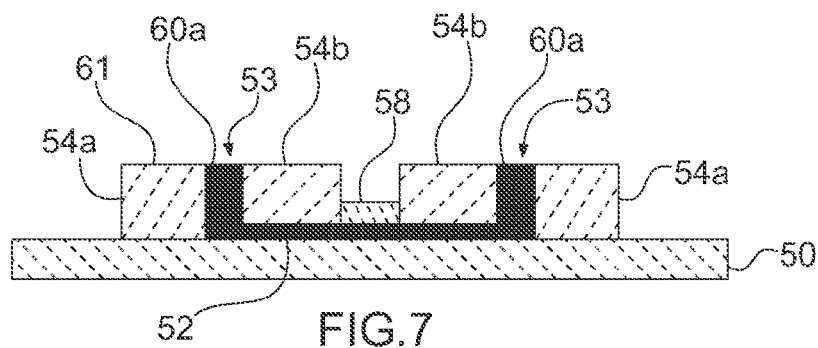

A substrate 50 is provided having the bottom metallic wall 52 of the coaxial waveguide conductor cable 78 disposed thereon, FIG. 4. A sacrificial material 54a, 54b may be deposited by 3D inkjet printing 56, or other suitable 3D additive build process, in a desired pattern to define a location 53 of a lower portion of the coax sidewall 68 (cf. FIG. 16) and a pocket 55 for additional desired structure(s) and/or devices, such as a non-conductive support post for a central conductor 69 of the coax cable 78, FIG. 5. A passivation layer 58 may then be deposited in the pocket 55, FIG. 6. The passivation layer 58 may be non-conductive and prevent metal plating on the passivation layer 58. Metal plating, or other suitable metallization processes, may next be performed to fill the location 53 with metal to provide a lower sidewall portion 60a disposed in continuity with the bottom metallic wall 52, FIG. 7. Again, planarization techniques may be included here to planarize the uppers surfaces 61 to remove excess metal which might be deposited due to overplating. Planarization in this and/or any of the steps requiring planarization may be achieved by one or more of CMP, lapping, polishing, grinding, diamond turning, lathe turning, milling, and the like. This may optionally be done instead after the next step for the support post, or may optionally be done at any step if and as needed.

Figure 8A:
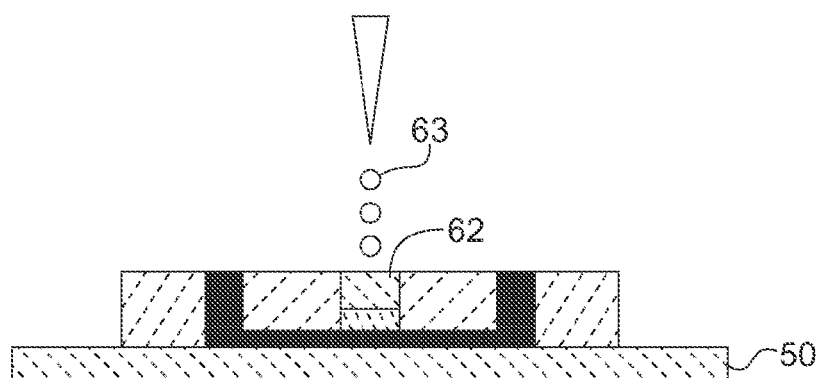

A support post 62 may be deposited by inkjet printing a non-conductive material 63, such as any of the above mentioned dielectric materials, over the passivation layer 58 to provide support for the central conductor 69 of the coax cable 78, FIG. 8A. Planarization may optionally be used at this stage to provide a level surface, although adjustments may be made in the printing process to allow for any over deposition. While deposition of passivation layer 58 and support post 62 are shown here as comprising two separate materials and steps, the passivation layer 58 and support post 62 may comprise the same material, such as a non-metallizable material, and may be formed in one deposition or forming step.

Figure 8B:
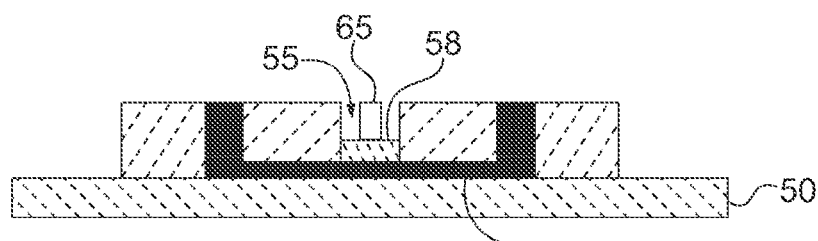

Optionally, while material 62 in FIG. 8A is shown as a support post material being deposited on the non-conductive layer 58, an object 65 may be inserted instead in the pocket or recess area 55, FIG. 8B, to realize devices other than the coax example illustrated in FIGS. 4-16. For example, the object 65 may include one or more of a chip (integrated circuit), a magnet, and a ferrite and could be inserted in the pocket 55. For example, a material or device that is not compatible with the utilized 3D additive build process, e.g., due to chemical or thermal requirements, or a device that needs more or less processing than the 3D additive build process allows could be inserted. The object 65 could be bonded to the passivation layer 58 and/or the bottom metallic wall 52 under the passivation layer 58 by one or more means such as, for example, a conductive or non-conductive adhesive, or the object 65 could be mechanically locked in place by subsequent deposition steps. Any suitable means such a pick and place, manual insertion, or self-assembly in a fluid using electrostatic attraction could be used to incorporate the device/object 65.

Figure 9:
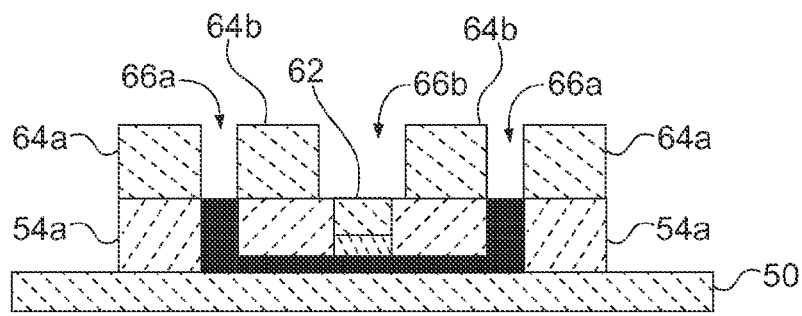
Figure 10:
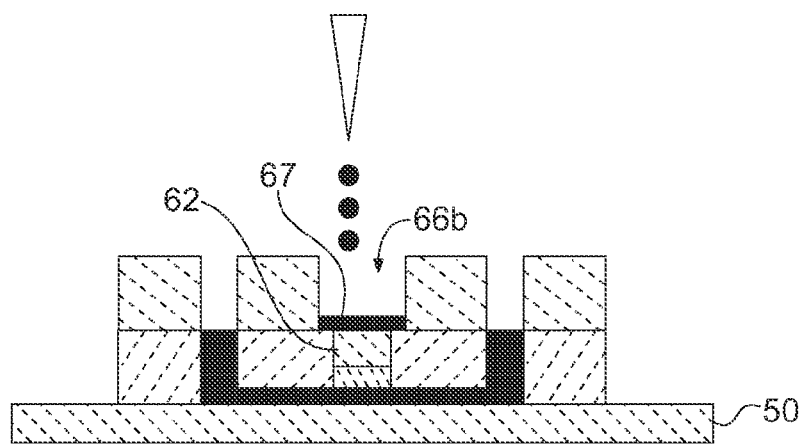
Figure 11:
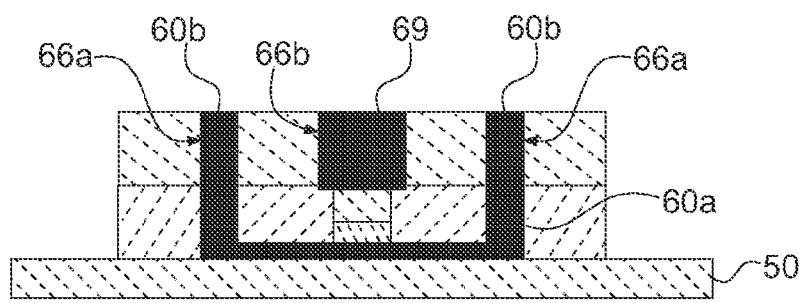

Resuming the coaxial build example, sacrificial material 64a, 64b may be deposited by 3D inkjet printing, or other suitable 3D additive build process, to define a location 66a of an intermediate portion of the coax sidewall 68 and a location 66b of the central conductor 69, FIGS. 9, 16. Since the support post 62 is non-conductive, a seed layer 67 that allows plating to occur on the support post 62, such as a metallization catalyst, or conductive thin film, may be deposited by inkjet printing, FIG. 10. Metal plating, or other suitable metallization process, may next be performed to fill the location 66b with metal to provide a center conductor 69, and to fill location 66a with metal to provide an intermediate sidewall portion 60b disposed in continuity with the lower sidewall portion 60a, FIG. 11.

Figure 12:
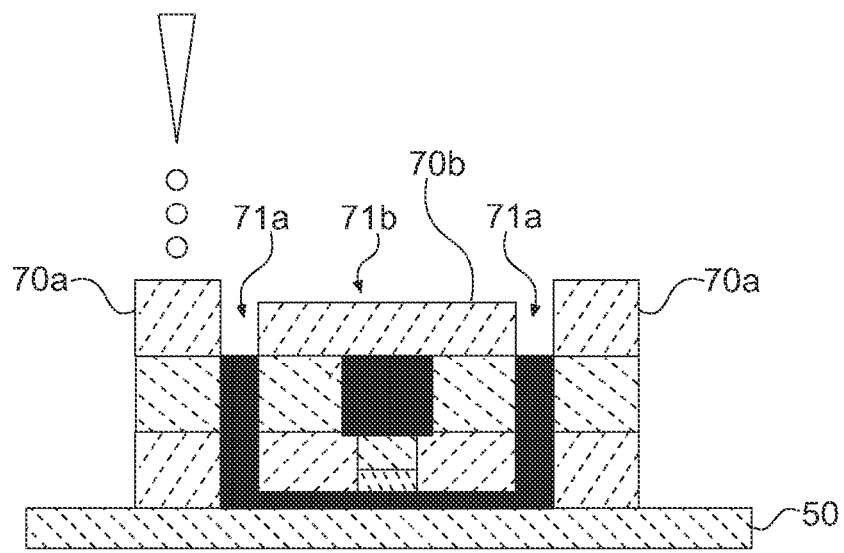

Sacrificial material 70a, 70b defining the location 71a of a top portion of the sidewall 68 and a location 71b of a top layer of the outer conductor 79 of the coax cable 78 is now deposited, FIGS. 12, 16. Note that, due to the versatility of the 3D additive build processes of the present invention, the thickness of 70a may be greater than the thickness of 70b so that plating of the top layers of the sidewall 68 and a top layer of the outer conductor 79 can occur concurrently.

Figure 13:
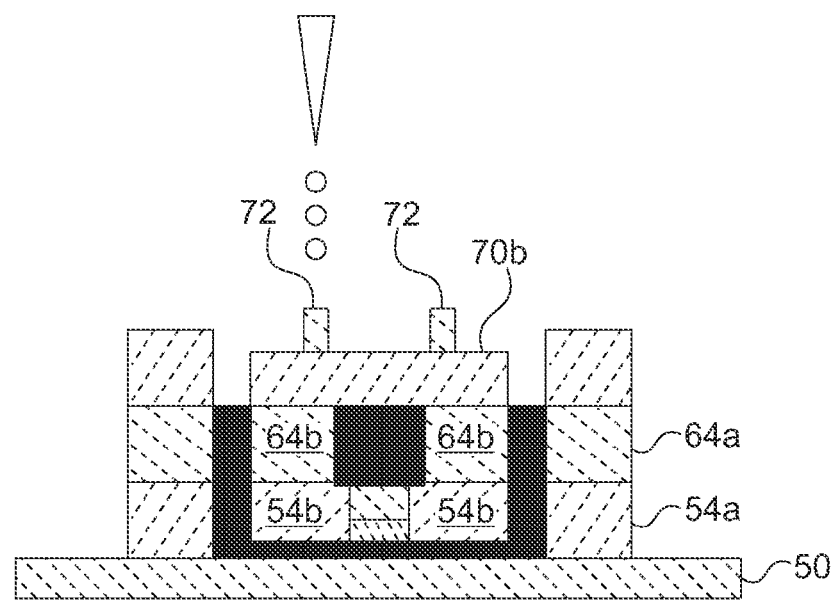
Figure 14:
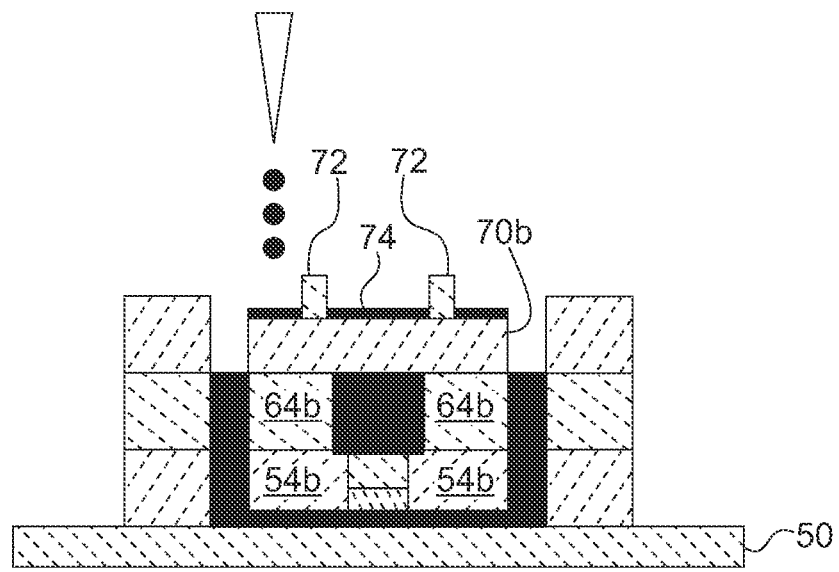
Figure 15:
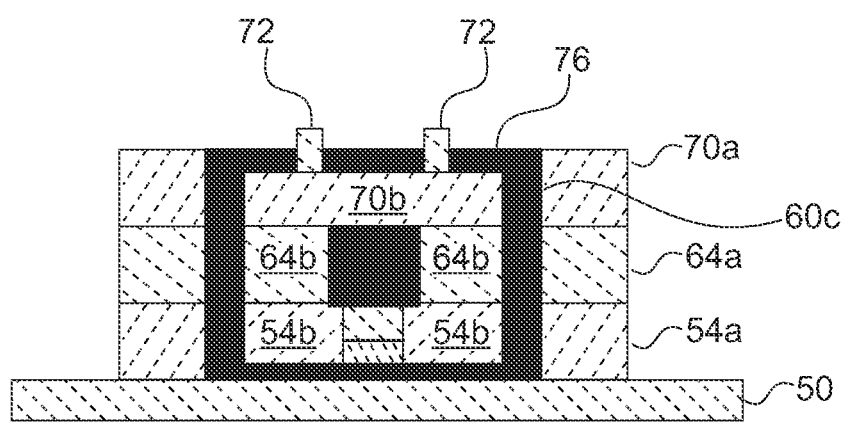

Dissolution plugs 72 may optionally be deposited via inkjet printing at selected location(s) on the surface of the sacrificial material 70b, FIG. 13. The plugs 72 may be composed of material that does not plate with metal and can be removed at a later time to reveal holes in the top of the complete coax cable 78 allowing a passageway for the sacrificial material 54b, 64b, 70b to pass during a removal process. A seed layer 74 may be deposited on the sacrificial material 70b allowing the top layer of the sacrificial material 70b to be plated in all the areas except where the dissolution plugs 72 are located, FIG. 14. Plating may then be performed to provide the top of the sidewall 60c and the top layer 76 of the coax cable 78, FIG. 15. Subsequently, the sacrificial dissolution plugs 72 and the sacrificial material 54a, 54b, 64a, 64b, 70a, 70b may be removed using suitable dissolution methods, such as those described herein, to provide for a coax cable 78, FIG. 16. The dissolution plugs 72 may be provided at any suitable location, including for example, in the sacrificial material 54a, 64a, 70a. The holes provided by the dissolution plugs 72 may be in locations and of a size and shape to minimize disruption of the desired electrical properties.

It should be noted that all the coating steps in this exemplary process were 3D additive build processes. Moreover, while plating was used as a method to obtain near bulk metallic properties in the 3D build, one or more of the plating steps could be replaced by a 3D printing step if suitable material properties needed can be obtained. Alternatively or additionally, as illustrated in the following example, conductive structures may be provided via metallization of selected non-conducting structures to yield solid or hollow structures having conductive surfaces as an alternative to structures with bulk electrical and/or thermal conductivity.

Figure 17:
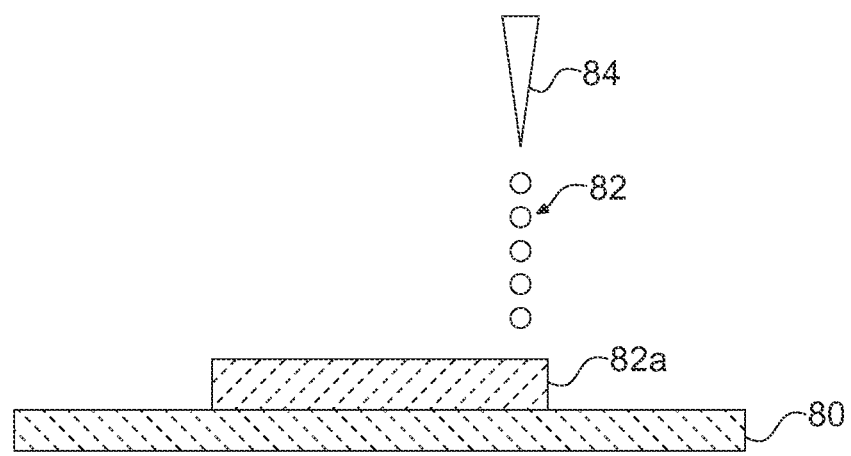
FIGS. 17-29B schematically illustrate cross-sectional views of an exemplary 3D printing process and structure in accordance with the present invention for the fabrication of a three dimensional, multilayered, coaxial cable.
Figure 18:
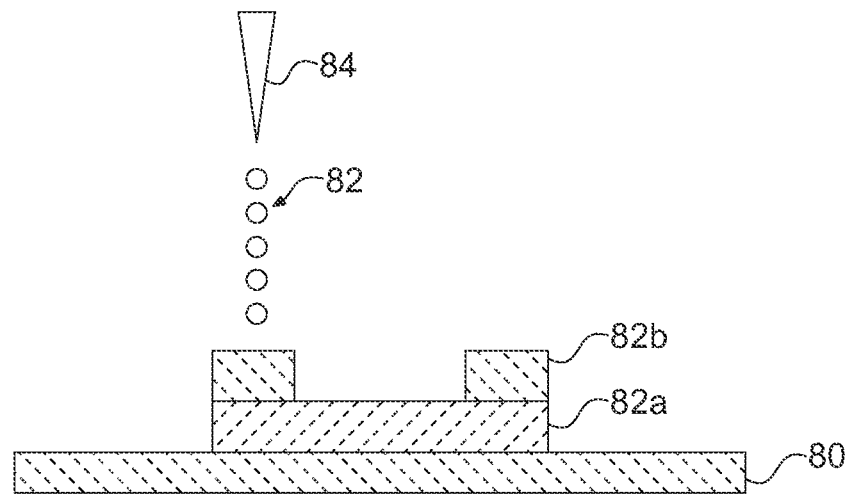

Turning to FIGS. 17-29B, a further example of a 3D additive build process of the present invention for creating a 3D coaxial structure with a primarily air dielectric is illustrated. A 3D deposition device 84 may deposit a first material 82 on a substrate 80 to provide a first layer 82a, FIG. 17. The deposition device 84 may be any device which can implement any suitable 3D additive build process, such as solid polymer printing, stereolithography, and/or similar method. Alternatively, the deposition device 84 may schematically represent the deposition and patterning process for a laminated plastic film and/or patterning process for a spin coated photoresist. In this example, the first material 82 may comprise a selectively metallizable polymer, plastic, and/or dielectric material and may be deposited in a thickness on the order of microns to centimeters depending on the scale of the object being created. A second layer 82b of the first material 82 may be deposited at selected location(s) on the first layer 82a, FIG. 18. A second material 90 may be deposited at selected location(s) on the first layer 82a through a deposition device 88 which may be the same or different from the deposition device 84. The second material 90 may be provide a support post 90a at a location and also create voids 91 between the support post 90a and second layer 82b. The second material 90 may be desirably chosen to be different from the material 82 of the first layer 82a so that the first layer 82a can be selectively metallized by a suitable metallization process, while the support post 90a is not metallized. Materials that are selectively metalizable, such as first material 82, can contain catalysts or other active sites that attract metal materials and compositions in their bulk or specifically on their surface. For example, the first material 82 may comprise a catalyzed form of the second material 90, where the catalyst renders the first material 82 metallizable. Additionally or alternatively, differences in physical properties, such as surface roughness, may be utilized to render a material selectively metallizable. For example, by surface roughness or surface porosity material 90 may not have a catalyst adhere in the same process in which is does adhere to the materials of 82a and 82b. Thus, by choice or engineering design of first and second materials and metallization process, the first and second layers 82a, 82b, having the metallizable compositions, may be selectively metallizable in comparison to the support post 90a.

A sacrificial scaffolding material 94 may be deposited through a deposition device 92, which may be the same or different than the deposition devices 84, 88, to selectively fill one or more of the voids 91 to provide a scaffolding 94a for subsequent structures or layers that may need to be suspended during the 3D additive build process. The use of a sacrificial scaffolding material 94 may be predicated on the need to suspend structures or to provide structures with a void region below them and may be used to support materials deposited with deposition devices 84, 88. The scaffolding 94*a* may be removed in a subsequent step. It should be clear to one skilled in the art of 3D microfabrication that the scaffolding 94*a* may not be required if, for example, a stereolithography or similar process is used where a liquid resin serves a similar function, e.g., where selective polymerization above a liquid layer may form features suspended by the unpolymerized liquid. In addition, other means to produce a suspended feature may be used, for example, the use of a rapidly solidifying material and forces such as cohesion or surface tension may be used in a 3D additive build system to create a suspended material without the need for a scaffolding material. In such examples, a similar build process can be used without the use of a scaffolding 94*a*.

Figure 21:
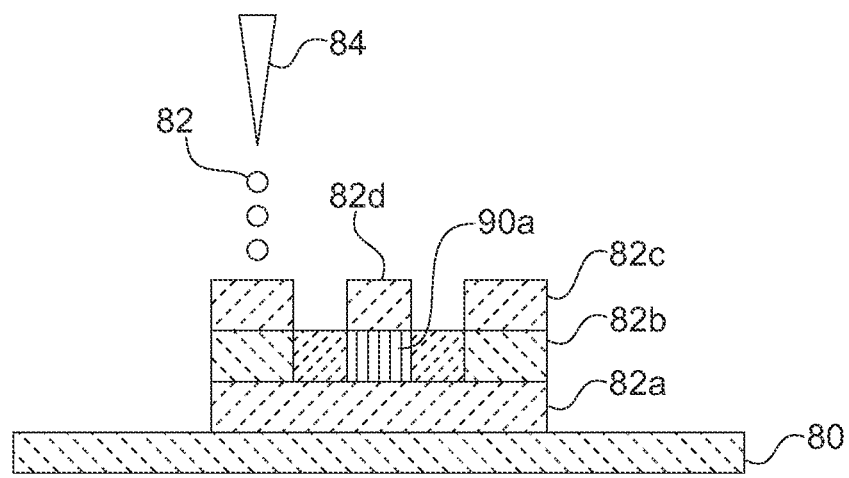
Figure 22:
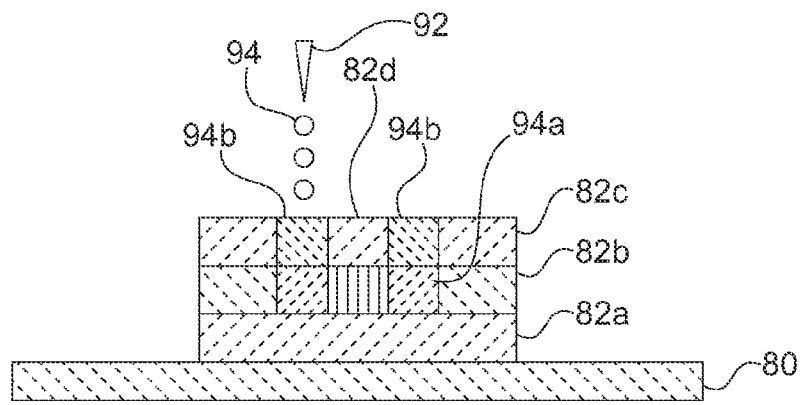
Figure 23:
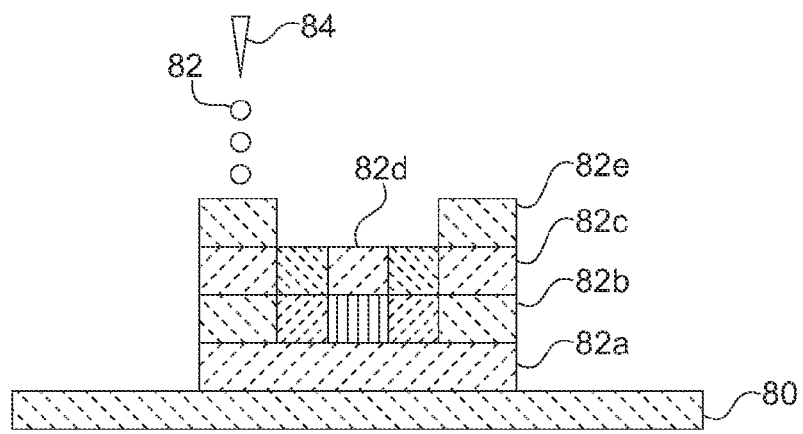
Figure 24:
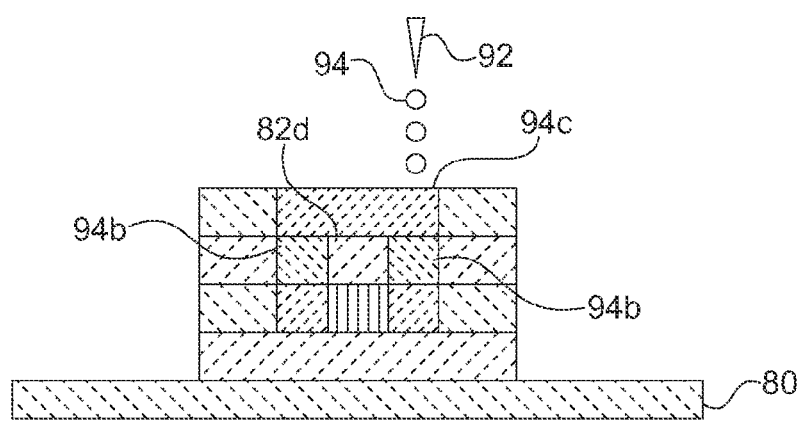

Returning to the build process, the deposition device 84 may next deposit a third layer of material 82 comprising structures 82*d*, 82*c* disposed over the support post 90*a* and the second layer 82*b*, respectively, FIG. 21. Additional sacrificial material 94 may be deposited through deposition device 92 over the scaffolding 94*a* in the voids between structures 82*d*, 82*c* to provide additional scaffolding 94*b* that may be subsequently removed, FIG. 22. The deposition device 84 may then deposit a fourth layer 82*e*, which may comprise the same as materials of layers 82*a*-82*d*, over the structure 82*c*, FIG. 23, and additional sacrificial material 94 may be deposited through means 92 over structures 82*d* and scaffolding 94*b* to provide additional scaffolding 94*c*, FIG. 24.

Figure 25:
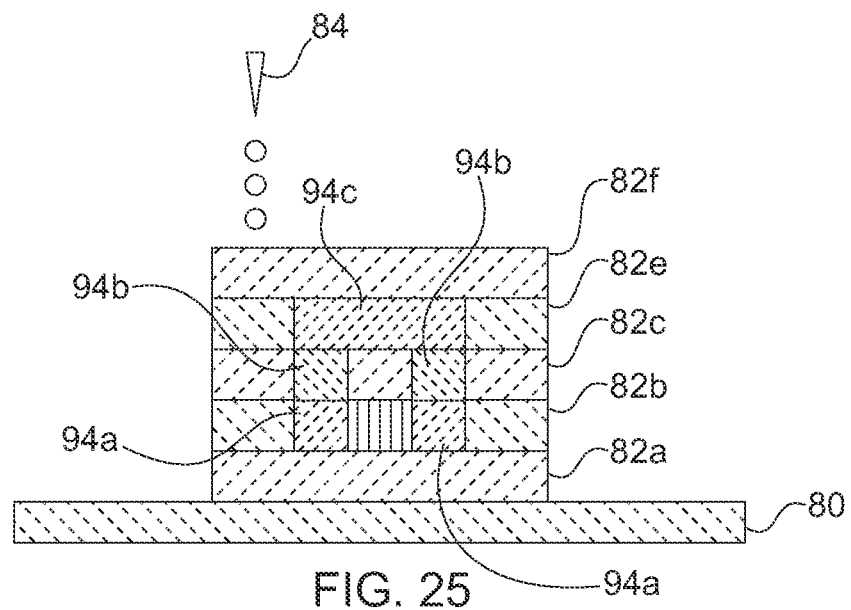

An upper structure 82*f* comprising the same material as the first layer 82*a* may be deposited through device 84 over the fourth layer 82*e* and additional scaffolding 94*c*, FIG. 25. The scaffolding 94*a*-94*c* may be selectively removed to provide a resulting coaxial-shaped structure 200 having a void 106 (air dielectric) therein, FIG. 26. As described earlier, the scaffolding 94*a*-94*c* may be dissolved through one or more of a solvent removal step, a thermal sublimation step, and a vapor removal process. For example, if layers 82*a*-82*f* and support post 90*a* were a catalyzed and a non-catalyzed ABS plastic, respectively, then the scaffolding 94*a*-94*c* may comprise a starch and removal may occur, for example, in hot water with ultrasonic agitation.

Figure 26:
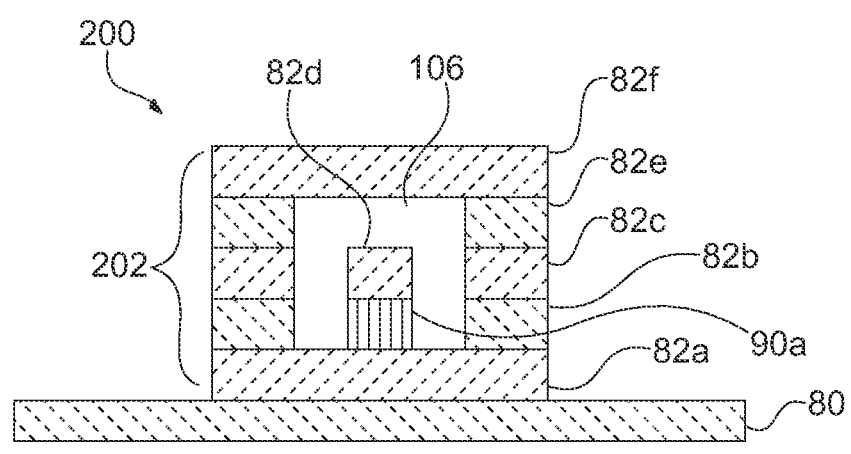
Figure 27A:
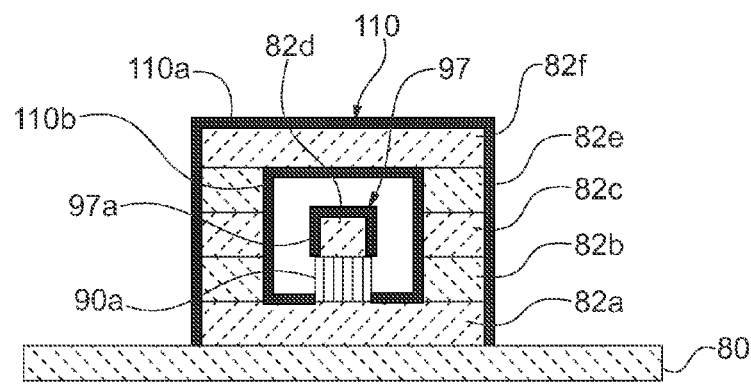
Figure 27B:
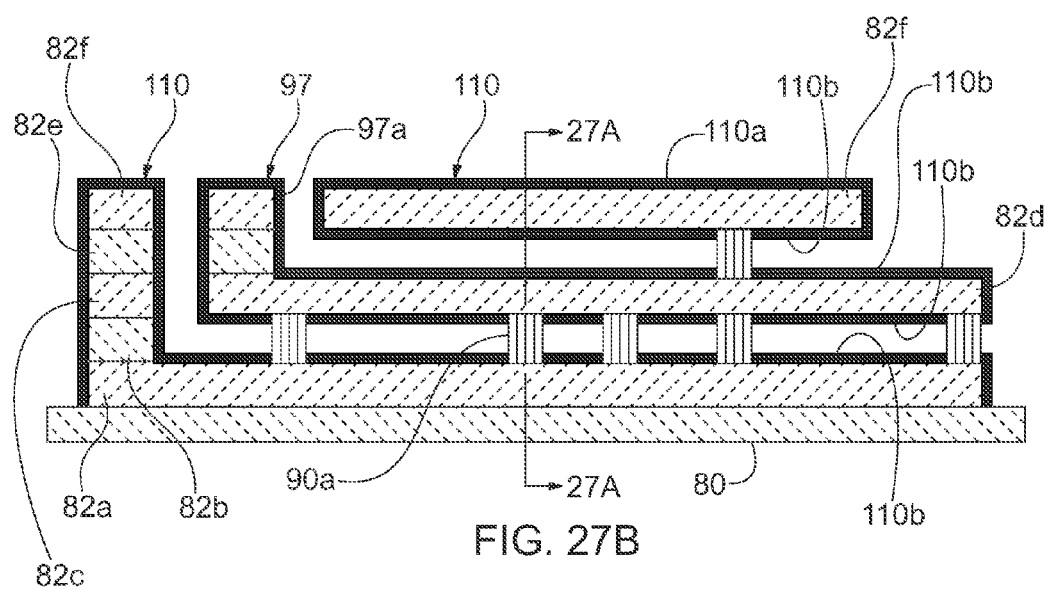

At this stage in the process the coaxial structure 200 may be nonconducting in view of the choice of materials 82, 90 utilized in the 3D additive build process, with layers 82*a*-82*f* collectively providing a metallizable core 202 for use as an outer conductor and layer 82*d* a metallizable core for use as an inner conductor, FIG. 26. A metallization process, may thus be performed to metallize those structures comprising the first material 82 (i.e., layers 82*a*-82*f*) while the support post 90*a* remains unmetallized, FIGS. 27A, 27B. Again, the first material 82 is selectively metallized relative to the support post material 90 due to compositional and/or surface physical differences, for example, between the first and second materials 82, 90, leading to a difference in the reaction of such materials 82, 90 to the particular metallization process utilized, i.e., selective metallization between materials 82, 90. (In other embodiments, the majority of the device may comprise a non-metallizable material, and any mixture and number of layers of metallizable material, non-metallizable material and voids may be produced with the present exemplary process.) FIGS. 27A, 27B schematically illustrate end-on and side cross-sectional views, respectively, of the coaxial structure 200 after the selective metallization, such as exposure to a metallization sequence involving an electroless copper or electroless silver or electroless gold coating process. As a result, a metallized inner conductor 97 is provided by the metal coating 97*a* disposed over layer 82*d*, and a metallized outer conductor 110 is provided by the metal coatings 110*a*, 110*b* disposed over the exterior and interior surfaces of layers 82*a*-82*c*, 82*e*, 82*f*, respectively. The inner conductor 97, having its core 82*d* formed, for example, as part of the process illustrated in FIG. 21, is electrically discontinuous from the outer conductor 110 due to non-metallized support post 90*a* formed in the steps illustrated in FIG. 20. As illustrated in FIG. 27B, the coaxial inner conductor 97 may extend upward to a top surface (on the left side) and exit at a port in the plane of the center conductor 97 (at the right side).

The metal coatings 97*a*, 110*a*, 110*b* may be submicron or may be several, 10's, 100's, or 1000's of microns thick depending on the scale of the structure formed and may be formed through means known in the arts of electroless and/or electrolytic plating as well as in electroforming. The coatings 97*a*, 110*a*, 110*b* may comprise more than one layer of metal, for example, of a layer of nickel and a layer of gold. Due to the RF skin depth, a thickness of several microns or less is capable of providing a low loss transmission line at frequencies above one or more GHz. It is noted that in some embodiments, a triaxial transmission line could also be formed in a similar sequence by making the coatings 110*a*, 110*b* formed on the inner and outer surfaces of the core 202 discontinuous and using a conductive substrate, for example.

Figure 19:
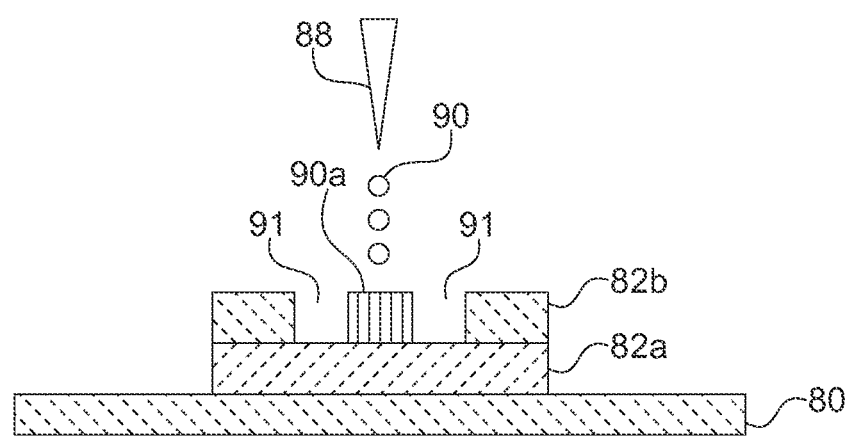
Figure 20:
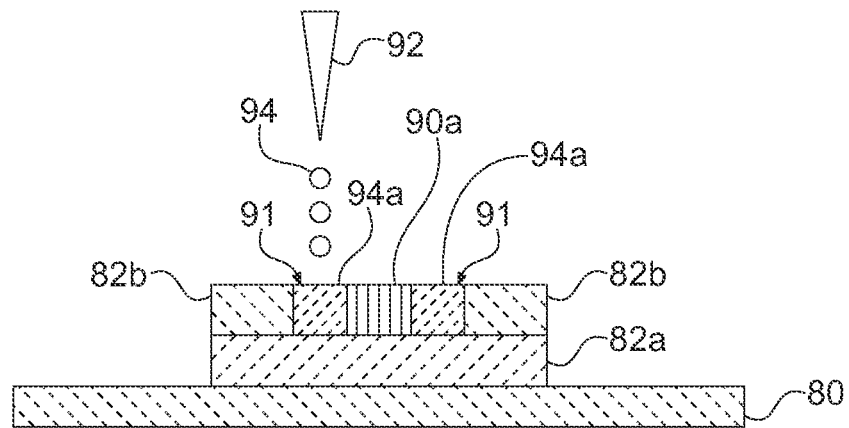

In addition, during the sequential build multiple support posts 90*a* may be deposited at the step illustrated in FIG. 19. Such support posts 90*a* can take forms including blocks, stubs, straps, sheets, rods and the like. While a simple transmission line section is illustrated, it should be clear that complex 3D multilayer networks of coax and waveguide components can be made by the exemplary 3D additive build process. While an inner conductor 97 is shown in this example of coax, by omitting the inner conductor 97, hollow core waveguides can equally be created in the same process. In addition, integration of DC bias and control lines, chip mounting regions, connectors and connector flanges, and elements of the device or system housing itself can be formed by 3D additive build processes.

Figure 28:
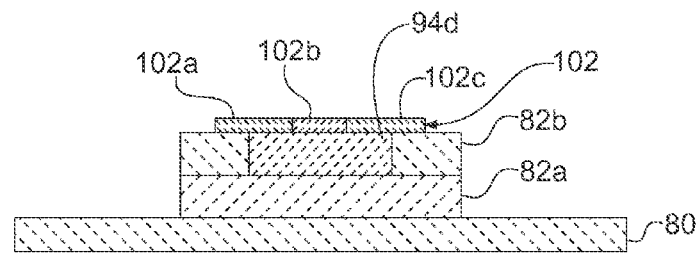
Figure 29A:
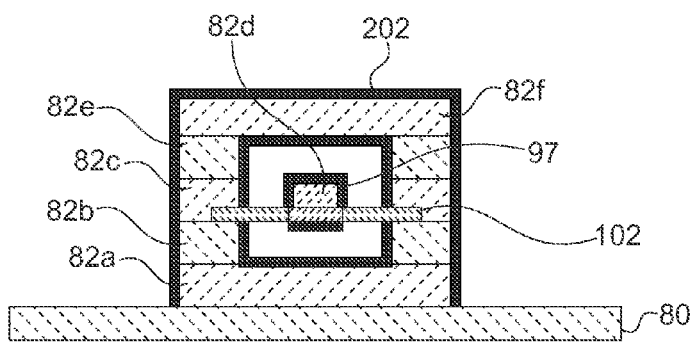
Figure 29B:
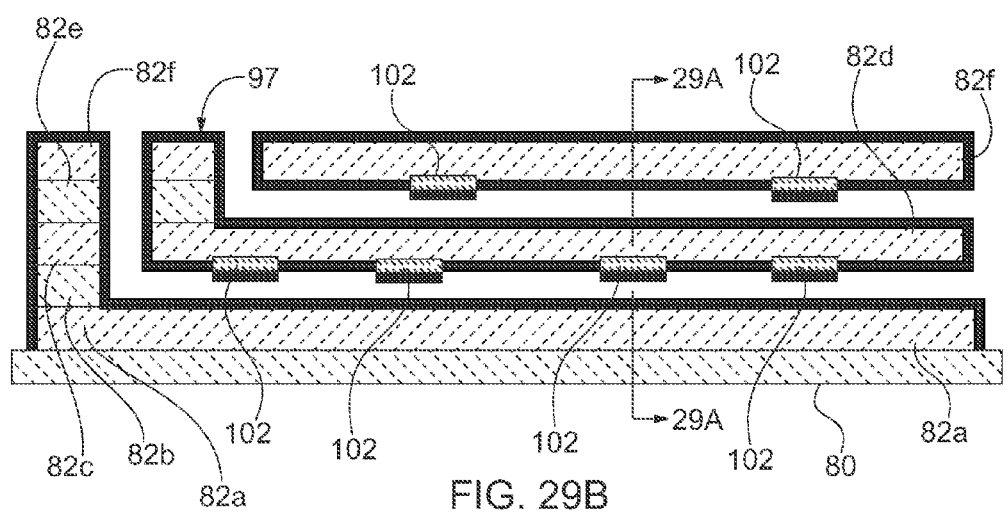

For example, the exemplary 3D additive build process may be altered beginning at the step of FIG. 19 by omitting the support post 90*a* and filling the voids 91 and region that had been occupied by the support post 90*a* with a sacrificial material to provide a scaffold 94*d*, FIG. 28. Subsequently, a support bar 102 may be deposited over portions of the second layer 82*b* and scaffold 94*d*. The support bar 102 may comprise metallizable portion 102*b* and non-metallizable portions 102*a*, 102*c*. Differentiation between metallizable portion 102*b* and non-metallizable portions 102*a*, 102*c* may be provided as a bulk property of the support bar 102, such as by providing a catalyst or other appropriate material to the metallizable portion 102*b* while the support bar 102 is being deposited. Alternatively or additionally, the metallizable portion 102*b* may be deposited as a separate material different in composition from the non-metallizable portions 102*a*, 102*c*. Still further, the metallizable portion 102*b* may be rendered metallizable as compared to the bulk properties of the support bar 102 by altering the surface properties, physical or chemical, of the support bar 102 at those locations. Processing may then continue to add additional layers and scaffolding materials as per the steps illustrated in FIGS. 21-26 followed by metallization as discussed above in connection with FIGS. 27A-27B to yield the coaxial structure illustrated in FIGS. 29A, 29B. Here, the support bar(s)

Figure 30:
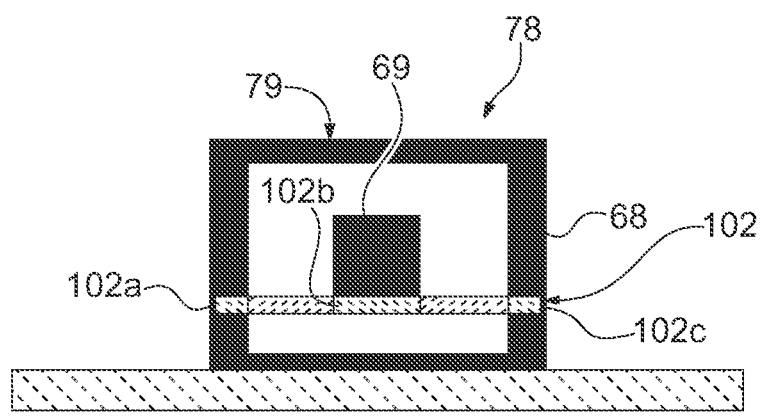
FIG. 30 schematically illustrates an alternative support structure for use in the structure of FIG. 16.

102 supports the inner conductor 97 providing the support function previously provided by support post 90a by virtue of the ends of the support bars 102 being embedded in the outer conductor core at layer 82c. Such a use of support bars 102 having metallizable portion 102b, and non-metallizable portions 102a, 102c may be implemented in other structures, such as in lieu of the support post 62 present in the example of FIG. 16, as illustrated in FIG. 30.

Optional release holes may be provided in closed structures or those that have limited flow to facilitate removal of the scaffolding 94a-94c and/or to facilitate the required fluid flow for the metal coating steps. Such holes, for example, may be added to upper layer 82f, or any layer, prior to metallization in locations and of a size to minimize disruption of the electrical properties desired, as per the use of dissolution plugs 72 as illustrated in FIGS. 1F, 1G, 13-15. The use of such release holes and their design and placement can be designed by one skilled in the art and may be assisted through software such as Ansoft's HFSS® for electromagnetic structures, Ansoft's Ansys® for mechanical or fluidic structures, and/or similar software products.

In addition, it should be clear that while a substrate 80 is used in the sequence illustrated in FIGS. 17-29B, structures could readily be released from the substrate 80, for example, by applying a sacrificial material, such as material 92, and/or by mechanically detaching the object from a platform, for example. Further, the selectively metallizable material 82 may remain in the final device; however, if the metal layers 90a, 110a, 110b are sufficiently thick, the selectively metallizable material 82 may be removed after deposition of the metal, for example through one or more openings in the metal layers 90a, 110a, 110b using methods which may leave the supports posts 90a intact. Moreover, while an electronic application is illustrated by way of example, many other applications such as fluidic devices, mechanical devices, and the like can be created.

These and other advantages of the present invention will be apparent to those skilled in the art from the foregoing specification. For example, the build process outlined may contain more or fewer layers and more or fewer materials depending on the end device and/or structure being made. The build process could be stopped at any point and items or other materials maybe inserted into the partially complete structure and the build process then continued to embed and/or interconnect the inserted materials and/or devices. For example, passive or active electronic devices, magnets, powders, liquids and/or such may be put into cavities or receptacles and the build process continued to partially or fully interconnect or encapsulate them. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A method for fabricating a three dimensional device, comprising:

depositing a first polymer material using three dimensional printing; and
    depositing a second polymer material using three dimensional printing, wherein:
    the second polymer material is capable of being selectively metallized with respect to the first polymer material; and the steps of depositing the first and second polymer materials create a coaxial structure having a metallizable center conductor core comprising the second polymer material and a metallizable outer conductor core comprising the second polymer material, with the first polymer material disposed between the center conductor core and outer conductor core to support the center conductor core in the outer conductor core.

2. The method of claim 1, comprising removing one of the first and second polymer materials.

3. The method of claim 1, comprising depositing a metal on the surfaces of the metallizable center and outer conductor cores.

4. The method of claim 1, wherein the step of depositing the first polymer material comprises creating a support post disposed between the center conductor core and the outer conductor core, the post comprising the first polymer material.

5. The method of claim 1, wherein the steps of depositing the first and second polymer materials comprises creating a support bar having first and second ends disposed within respective walls of the outer conductor core, the support bar disposed below the center conductor core to support the center conductor core within the outer conductor core.

6. The method of claim 1, wherein the second polymer material comprises a selectively metallizable surface.

7. The method of claim 6, comprising treating the selectively metallizable surface to accept a metallization catalyst for either electroless metallization or electrolytic metallization.

8. The method of claim 7, wherein the treatment is at least one or more of swelling, etching, oxidizing, plasma treating, and contacting with a metallization catalyst.

9. The method of claim 1, wherein at least one of the polymer materials comprises a metallizable component.

10. The method of claim 1, comprising electrolessly metallizing the second polymer material.

11. The method of claim 1, comprising electrolytically metallizing the second polymer material.

12. The method of claim 1, wherein at least one of the first and second polymer materials comprises a conductive polymer.

13. The method of claim 1, comprising providing a metal coating on a surface of the second polymer material.

14. The method of claim 1, wherein the three dimensional printing is at least one of stereolithography, 2-photon stereolithography, inkjet, hot melt extrusion fabrication, or selective laser sintering.

15. The method of claim 1, wherein the three dimensional printing comprises stereolithography and wherein a liquid monomer or polymer is replaced with a different liquid monomer or polymer at selected stages during the stereolithographic process.

* * * * *